(12) United States Patent
Lung

(10) Patent No.: US 7,456,421 B2
(45) Date of Patent: Nov. 25, 2008

(54) VERTICAL SIDE WALL ACTIVE PIN STRUCTURES IN A PHASE CHANGE MEMORY AND MANUFACTURING METHODS

(75) Inventor: Hsiang-Lan Lung, Elmsford, NY (US)

(73) Assignee: Macronix International Co., Ltd., Hsinchu (TW)

( * ) Notice: Subject to any disclaimer, the term of this patent is extended or adjusted under 35 U.S.C. 154(b) by 318 days.

(21) Appl. No.: 11/381,397

(22) Filed: May 3, 2006

(65) Prior Publication Data

US 2007/0176261 A1    Aug. 2, 2007

Related U.S. Application Data

(60) Provisional application No. 60/763,272, filed on Jan. 30, 2006.

(51) Int. Cl.
*H01L 29/06* (2006.01)
*H01L 47/00* (2006.01)

(52) U.S. Cl. ............ 257/5; 257/3; 257/4; 257/200; 257/528; 257/536; 257/E27.004; 257/E45.002; 438/253; 438/396; 438/704

(58) Field of Classification Search ............ 257/3–5, 257/200, 528, 536, E27.004, E45.002; 438/253, 438/396, 704
See application file for complete search history.

(56) References Cited

U.S. PATENT DOCUMENTS 3,271,591 A    9/1966    Ovshinsky
3,530,441 A    9/1970    Ovshinsky
4,599,705 A    7/1986    Holmberg et al.
4,719,594 A    1/1988    Young et al.
4,876,220 A   10/1989    Mohsen et al.

(Continued)

FOREIGN PATENT DOCUMENTS

WO    WO 00/45108 A1    8/2000

(Continued)

OTHER PUBLICATIONS

Adler, David, "Amorphous-Semiconductor Devices," Sci. Amer., vol. 236, pp. 36-48, May 1977.

(Continued)

*Primary Examiner*—M. Wilczewski
*Assistant Examiner*—Telly D Green
(74) *Attorney, Agent, or Firm*—Haynes Beffel & Wolfeld LLP

(57) ABSTRACT

A programmable resistor memory, such as a phase change memory, with a memory element comprising narrow vertical side wall active pins is described. The side wall active pins comprise a programmable resistive material, such as a phase change material. In a first aspect of the invention, a method of forming a memory cell is described which comprises forming a stack comprising a first electrode having a principal surface with a perimeter, an insulating layer overlying a portion of the principal surface of the first electrode, and a second electrode vertically separated from the first electrode and overlying the insulating layer. Side walls on the insulating layer and on the second electrode are positioned over the principle surface of the first electrode with a lateral offset from the perimeter of the first electrode.

17 Claims, 21 Drawing Sheets

U.S. PATENT DOCUMENTS

| | | |
|---|---|---|
| 5,166,096 A | 11/1992 | Cote et al. |
| 5,166,758 A | 11/1992 | Ovshinsky et al. |
| 5,177,567 A | 1/1993 | Klersy et al. |
| 5,534,712 A | 7/1996 | Ovshinsky et al. |
| 5,687,112 A | 11/1997 | Ovshinsky |
| 5,789,277 A | 8/1998 | Zahorik et al. |
| 5,789,758 A | 8/1998 | Reinberg |
| 5,814,527 A | 9/1998 | Wolstenholme et al. |
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,920,788 A | 7/1999 | Reinberg |
| 5,952,671 A | 9/1999 | Reinberg et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan |
| 6,025,220 A | 2/2000 | Sandhu |
| 6,031,287 A | 2/2000 | Harshfield |
| 6,034,882 A | 3/2000 | Johnson et al. |
| 6,077,729 A | 6/2000 | Harshfield |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,314,014 B1 | 11/2001 | Lowrey et al. |
| 6,320,786 B1 | 11/2001 | Chang et al. |
| 6,339,544 B1 | 1/2002 | Chiang et al. |
| 6,351,406 B1 | 2/2002 | Johnson et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,462,353 B1 | 10/2002 | Gilgen |
| 6,483,736 B2 | 11/2002 | Johnson et al. |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,514,788 B2 | 2/2003 | Quinn |
| 6,534,781 B2 | 3/2003 | Dennison |
| 6,545,903 B1 | 4/2003 | Wu |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,579,760 B1 | 6/2003 | Lung |
| 6,586,761 B2 | 7/2003 | Lowrey |
| 6,589,714 B2 | 7/2003 | Maimon et al. |
| 6,593,176 B2 | 7/2003 | Dennison |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,744,088 B1 | 6/2004 | Dennison |
| 6,791,102 B2 | 9/2004 | Johnson et al. |
| 6,797,979 B2 | 9/2004 | Chiang et al. |
| 6,800,563 B2 | 10/2004 | Xu |
| 6,815,704 B1 | 11/2004 | Chen |
| 6,861,267 B2 | 3/2005 | Xu et al. |
| 6,864,500 B2 | 3/2005 | Gilton |
| 6,864,503 B2 | 3/2005 | Lung |
| 6,867,638 B2 | 3/2005 | Saiki et al. |
| 6,888,750 B2 | 5/2005 | Walker et al. |
| 6,894,305 B2 | 5/2005 | Yi et al. |
| 6,927,410 B2 | 8/2005 | Chen |
| 6,933,516 B2 | 8/2005 | Xu |
| 6,936,840 B2 | 8/2005 | Sun et al. |
| 6,937,507 B2 | 8/2005 | Chen |
| 6,992,932 B2 | 1/2006 | Cohen |
| 2004/0248339 A1 | 12/2004 | Lung |
| 2005/0093022 A1* | 5/2005 | Lung .......................... 257/200 |
| 2005/0215009 A1 | 9/2005 | Cho |
| 2006/0110878 A1* | 5/2006 | Lung et al. ................. 438/253 |

FOREIGN PATENT DOCUMENTS

| | | |
|---|---|---|
| WO | WO 00/79539 A1 | 12/2000 |
| WO | WO 01/45108 A1 | 6/2001 |

OTHER PUBLICATIONS

Adler, D. et al., "Threshold Switching in Chalcogenide-Glass Thin Films," J. Appl/Phys 51(6), Jun. 1980, pp. 3289-3309.

Ahn, S.J. et al., "A Highly Manufacturable High Density Phase Change Memory of 64 Mb and Beyond," IEEE IEDM 2004, pp. 907-910.

Axon Technologies Corporation paper: Technology Description, pp. 1-6.

Bedeschi, F. et al., "4-MB MOSFET-Selected Phase-Change Memory Experimental Chip," IEEE, 2004, 4 pp.

Blake thesis, "Investigation of GeTeSb5 Chalcogenide Films for Use as an Analog Memory," AFIT/GE/ENG/00M-04, Mar. 2000, 121 pages.

Chen, An et al., "Non-Volatile Resistive Switching for Advanced Memory Applications," IEEE IEDM, Dec. 5-7, 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y. H. et al. "An Edge Contact Type Cell fro Phase Change RAM Featuring Very Low Power Consumption," 2003 Symposium on VLSI Technology Digest of Technical Papers, pp. 175-176.

Haring Bolivar, P. et al., "Lateral Design for Phase Change Random Access Memory Cells with Low-Current Consumption," presented at 3$^{rd}$ E*PCOS 04 Symposium in Balzers, Principality of Liechtenstein, Sep. 4-7, 2004, 4 pp.

Horii, H. et al., "A Novel Cell Technology Using N-doped GeSbTe Films for Phase Change RAM," 2003 Symposium on VLSI Technology Digest of Technical Papers, pp. 177-178.

Hwang, Y. N. et al., "Full Integration and Reliability Evaluation of Phase-change RAM Based on 0.24 μm-CMOS Technologies," 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA, 2004, pp. 28-29 and workshop cover sheet.

Kim, Kinam et al., "Reliability Investigations for Manufacturable High Density PRAM," IEEE 43$^{rd}$ Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L.; "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., OUM-A 180 nm Nonvolatile Memory Cell Element Technology for Stand Alone and Embedded Applications, IEEE IEDM 2001, pp. 803-806.

Lankhorst, Martijn H. R., et al; Low-Cost and Nanoscale Non-Volatile Memory Concept for Future Silicon Chips, Mar. 13, 2005, 6 pp., Nature Materials Advance Online Publication, www.nature.com/naturematerials.

Mott, Nevill, "Electrons in Glass," Nobel Lecture, Dec. 8, 1977, Physics, 1977, pp. 403-413.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al., "Novel µTrench Phase-Change Memory Cell for Embedded and Stand-Alone Non-Volatile Memory Applications," 2004 Symposium on VLSI Technology Digest of Technical Papers, pp. 18-19.

Prakash, S. et al., "A Guideline for Designing Chalcogenide-Based Glasses for Threshold Switching Characteristics," IEEE Electron Device Letters, vol. 18, No. 2, Feb. 1997, pp. 45-47.

Rochefort, C. et al., "Manufacturing of High Aspect-Ration p-n Junctions Using Vapor Phase Doping for Application in Multi-Resurf Devices," IEEE 2002.

Strauss, Karl F. et al., "Overview of Radiation Tolerant Unlimited Write Cycle Non-Volatile Memory," IEEE 2000.

Subramanian, Vivek et al., "Low Leakage Germanium-Seeded Laterally-Crystallized Single-Grain 100-nm TFT's for Vertical Intergration Applications," IEEE Electron Device Letters, vol. 20, No. 7, Jul. 1999.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8 pages.

Wicker, Guy, "A Comprehensive Model of Submicron Chalcogenide Switching Devices," Doctoral Dissertation, Wayne State University, Detroit, MI, 1996.

Wolf, Stanley, Excerpt from: Silicon Processing for the VLSI Era-vol. 4, pp. 674-679, 2004.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

* cited by examiner

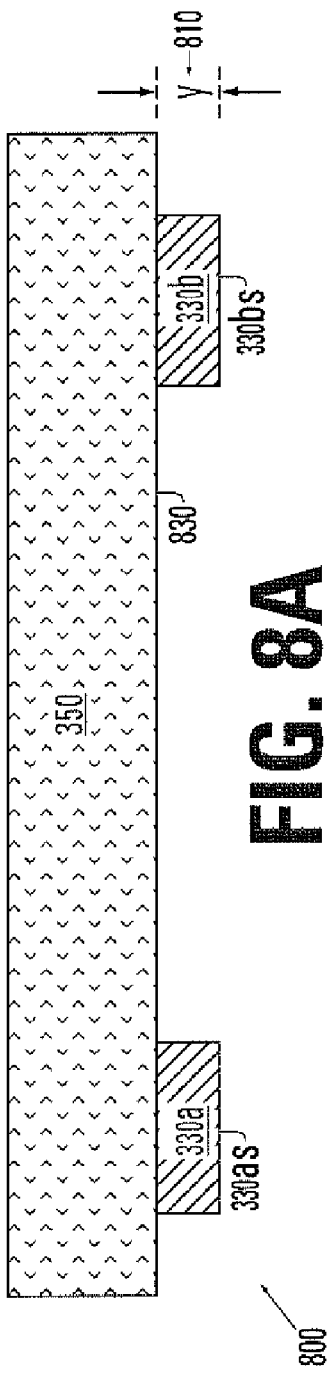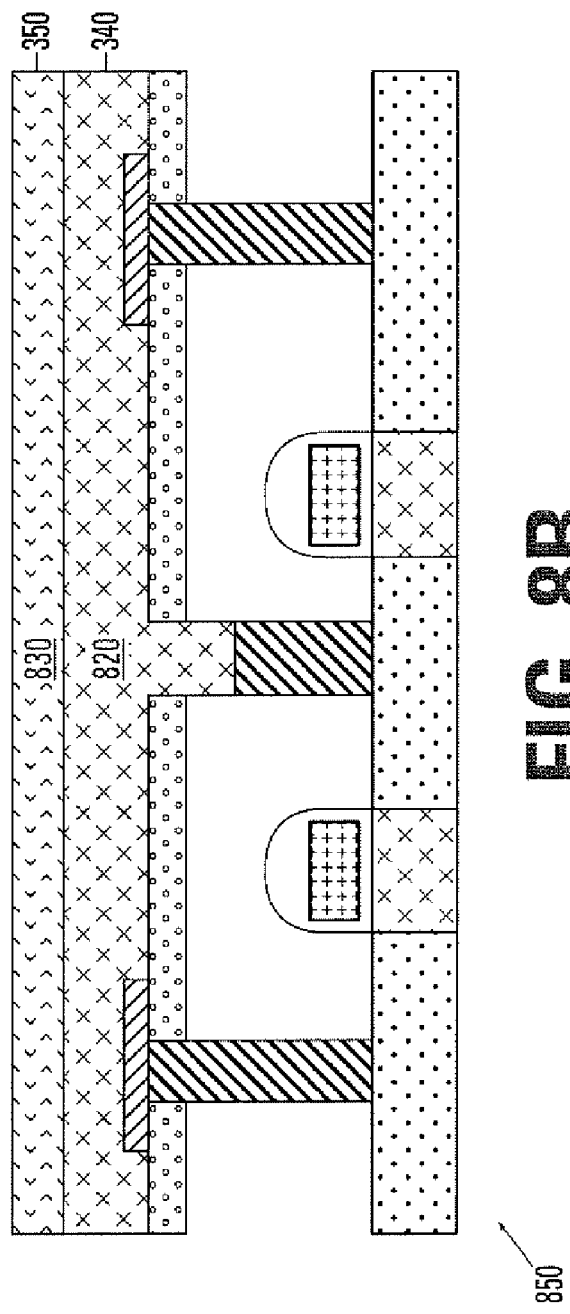

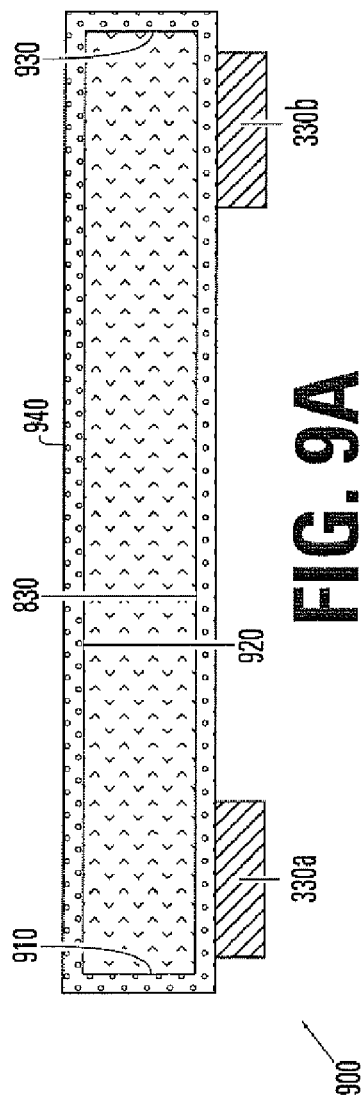
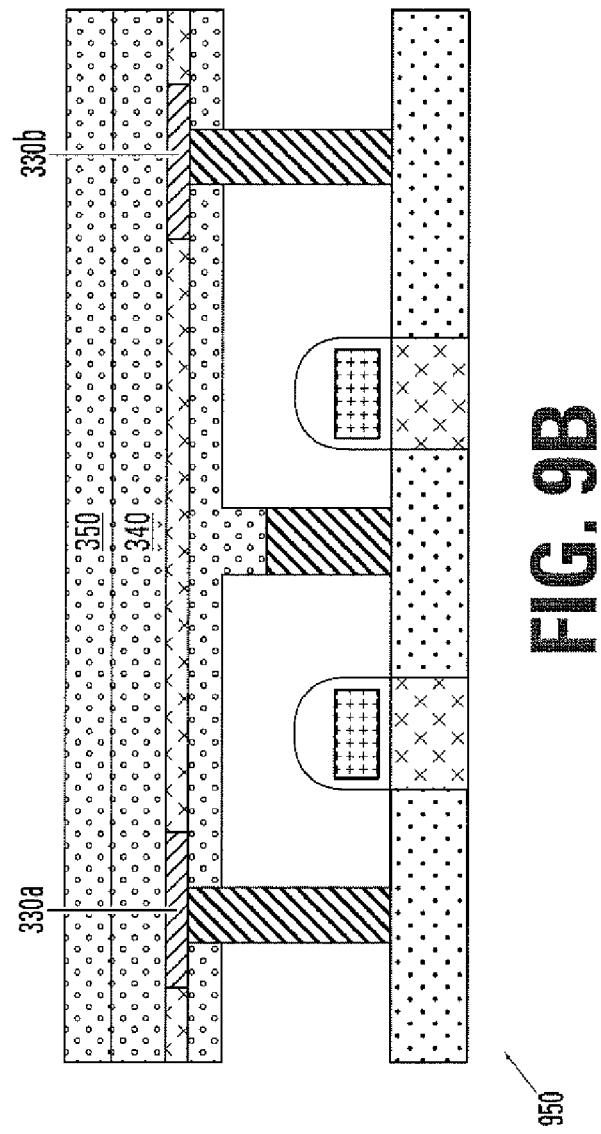

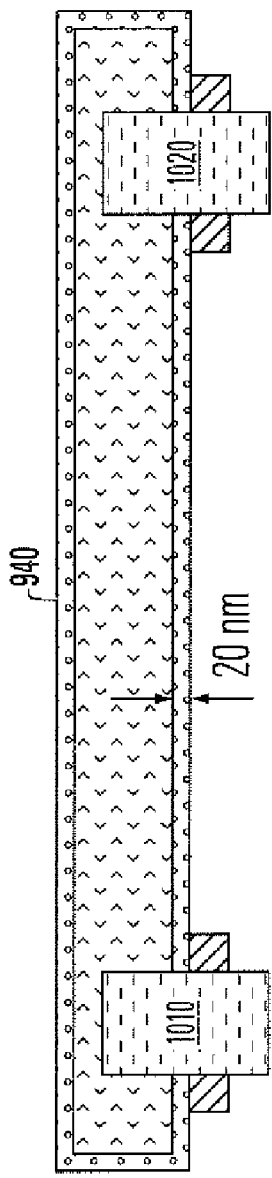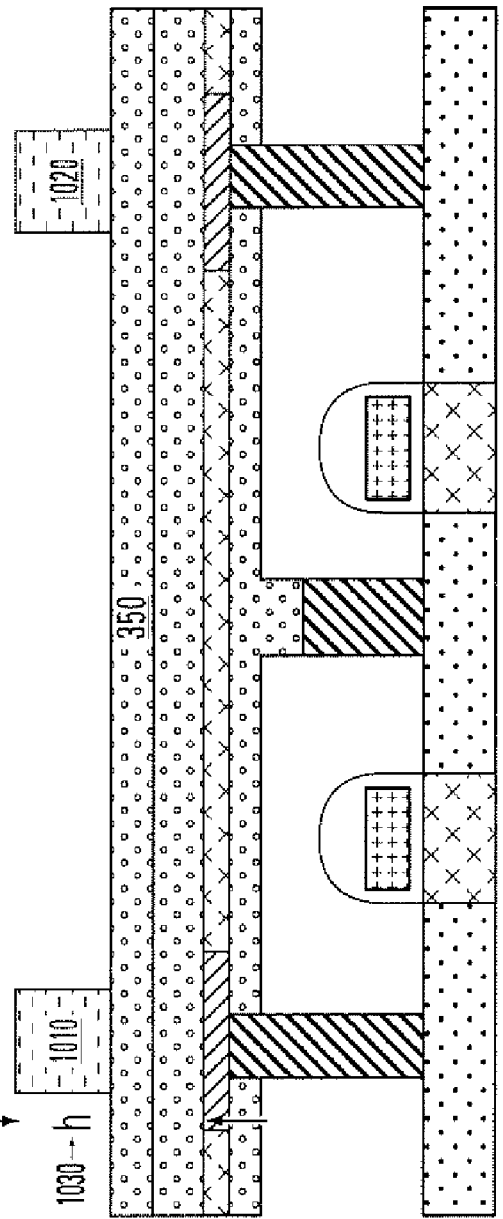

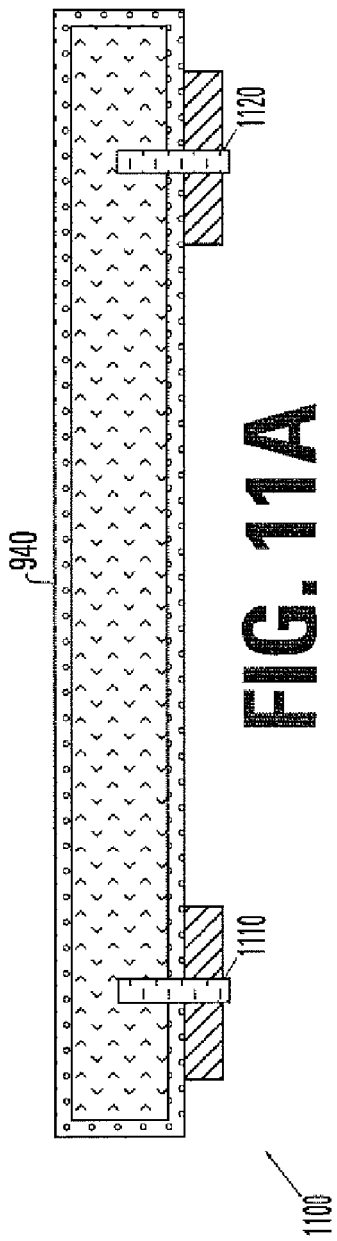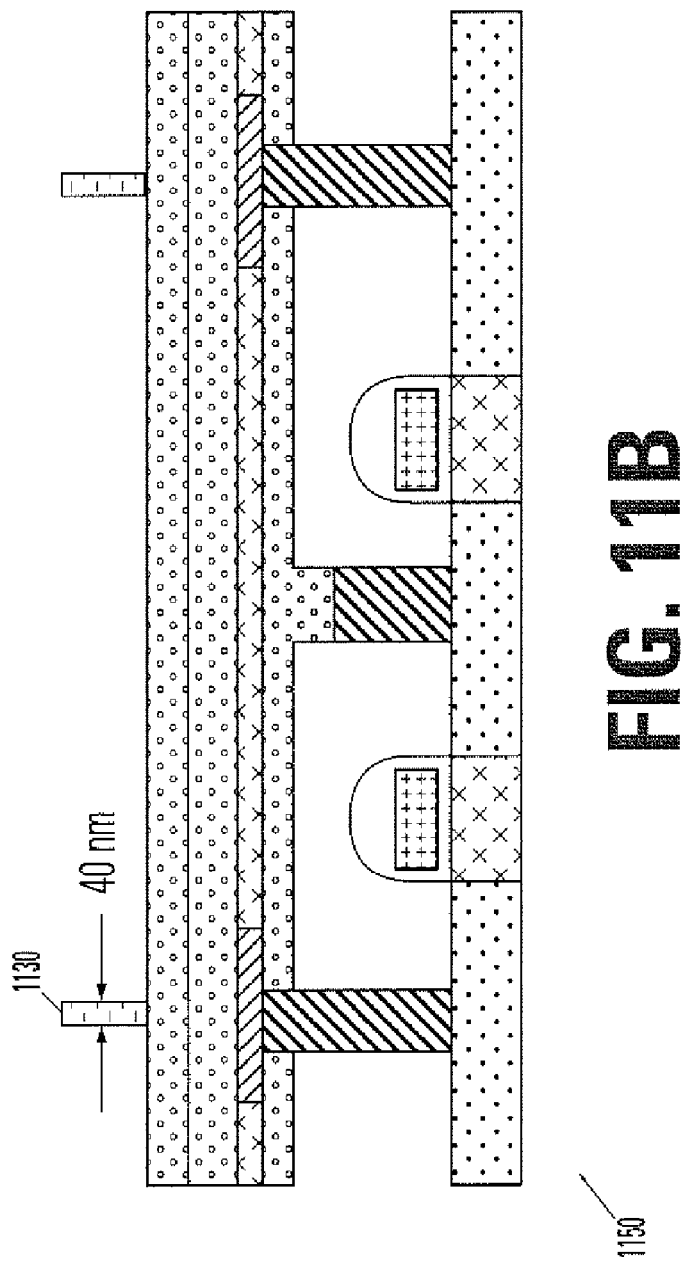

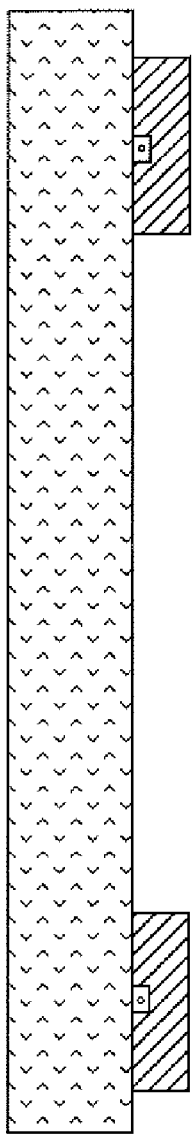
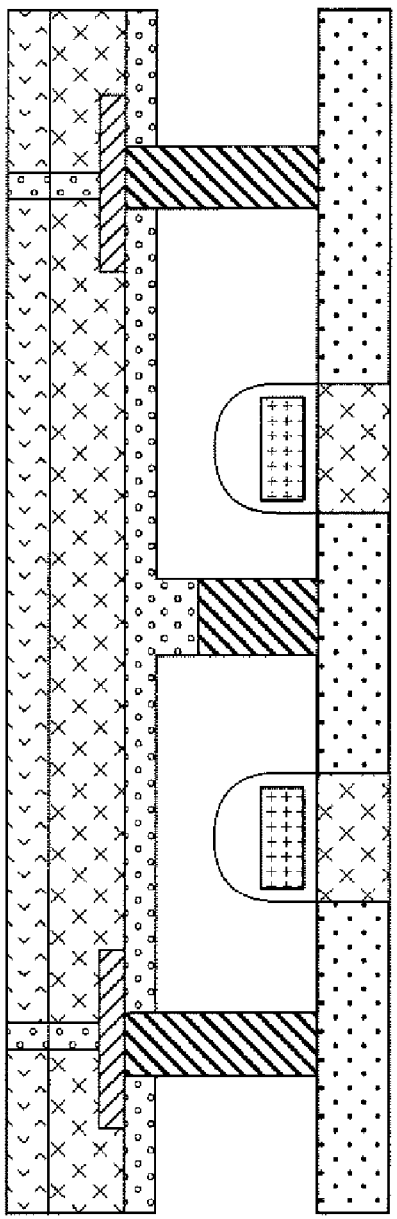

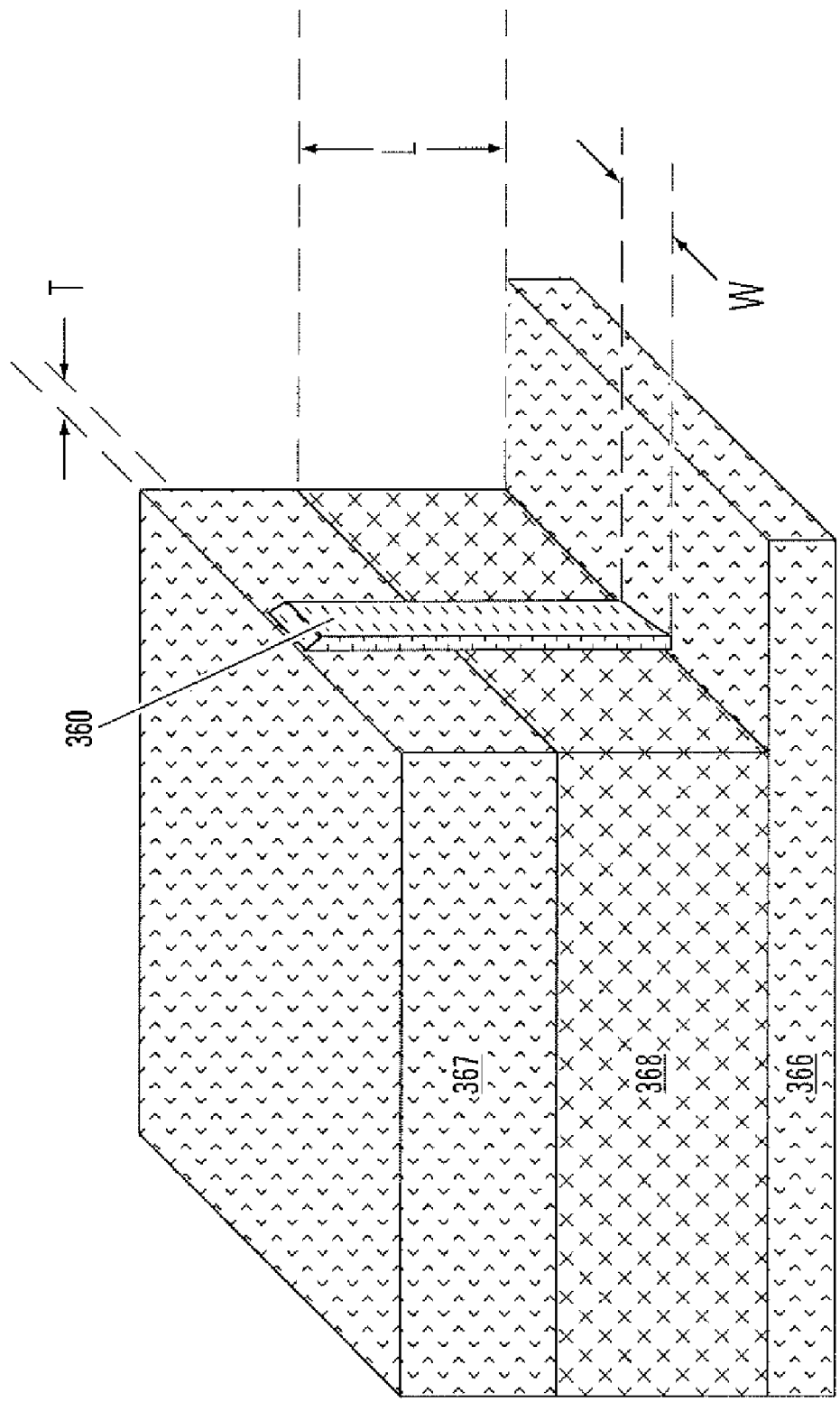

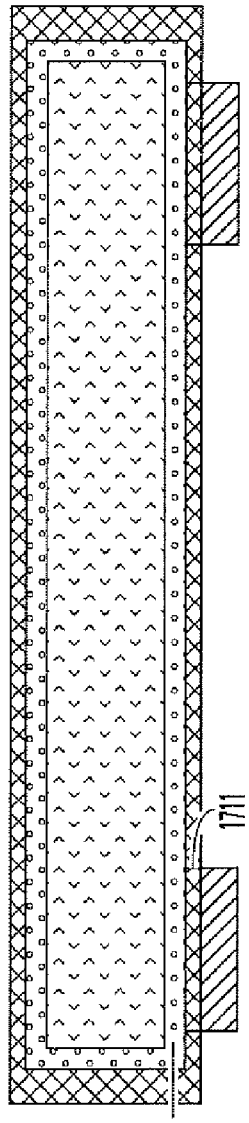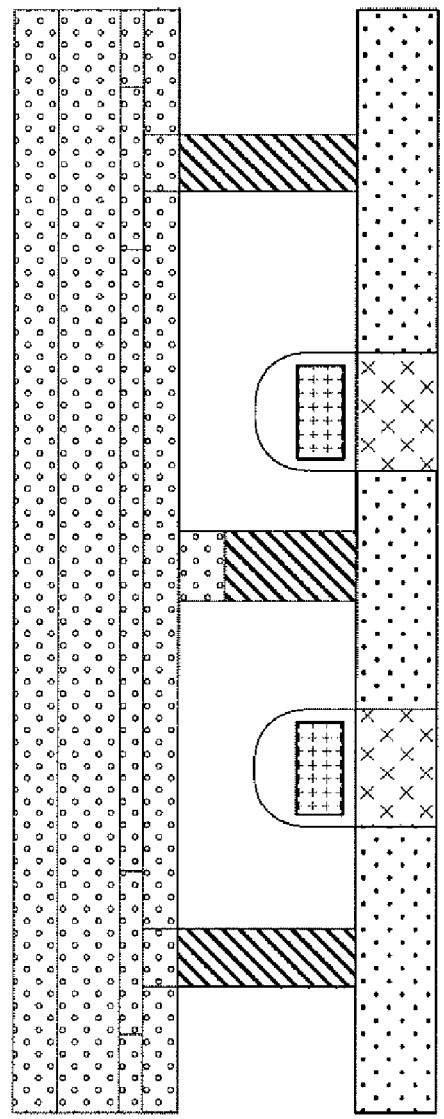

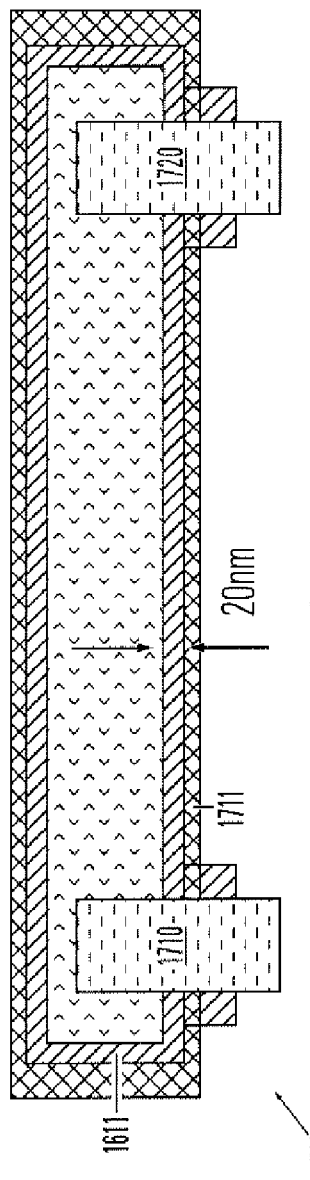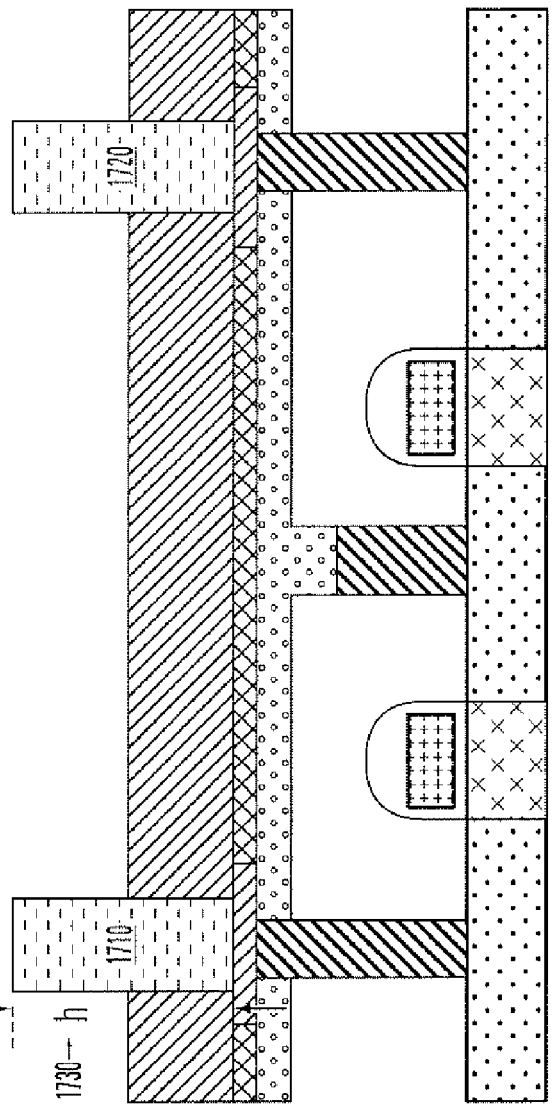

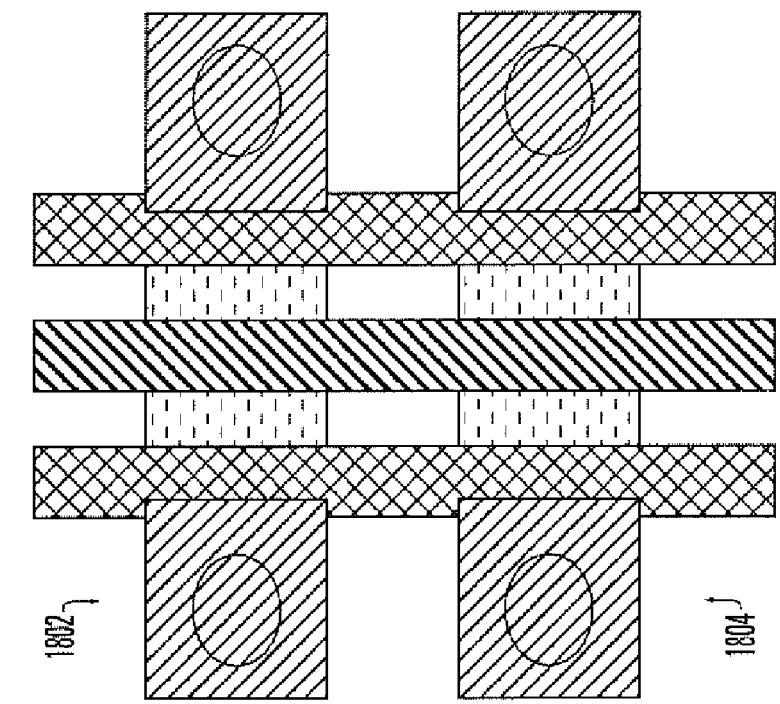
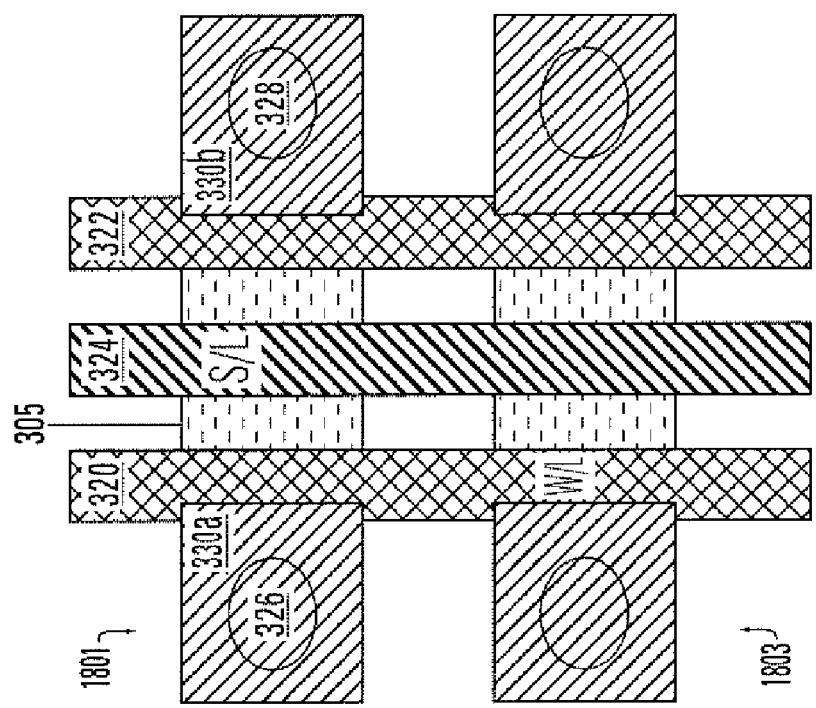
FIG. 18

US 7,456,421 B2

VERTICAL SIDE WALL ACTIVE PIN STRUCTURES IN A PHASE CHANGE MEMORY AND MANUFACTURING METHODS

RELATED APPLICATION DATA

The benefit of U.S. Provisional Patent Application No. 60/763,272, filed 30 Jan. 2006, entitled Vertical Side Wall Active Pin Phase Change Memory Structure and Method, is hereby claimed.

PARTIES TO A JOINT RESEARCH AGREEMENT

International Business Machines Corporation, a New York corporation; Macronix International Corporation, Ltd., a Taiwan corporation, and Infineon Technologies A. G., a German corporation, are parties to a Joint Research Agreement.

BACKGROUND OF THE INVENTION

1. Field of the Invention

The present invention relates to high density memory devices based on programmable resistive memory materials, including chalcogenide based materials and other materials, and to methods for manufacturing such devices.

2. Description of Related Art

Phase change based memory materials are widely used in read-write optical disks. These materials have at least two solid phases including, for example, a generally amorphous solid phase and a generally crystalline solid phase. Laser pulses are used in read-write optical disks to switch between phases and to read the optical properties of the material after the phase change.

Phase change based memory materials, like chalcogenide based materials and similar materials, can also be caused to change phase by application of electrical current at levels suitable for implementation in integrated circuits. The generally amorphous state is characterized by higher resistivity than the generally crystalline state, which can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the phase change process, allowing at least a portion of the phase change structure to stabilize in the amorphous state. It is desirable to minimize the magnitude of the reset current used to cause transition of phase change material from crystalline state to amorphous state. The magnitude of the reset current needed for reset can be reduced by reducing the size of the phase change material element in the cell and of the contact area between electrodes and the phase change material, so that higher current densities are achieved with small absolute current values through the phase change material element.

One direction of development has been toward forming small pores in an integrated circuit structure, and using small quantities of programmable resistive material to fill the small pores. Patents illustrating development toward small pores include: Ovshinsky, "Multibit Single Cell Memory Element Having Tapered Contact," U.S. Pat. No. 5,687,112, issued Nov. 11, 1997; Zahorik et al., "Method of Making Chalogenide [sic] Memory Device," U.S. Pat. No. 5,789,277, issued Aug. 4, 1998; Doan et al., "Controllable Ovonic Phase-Change Semiconductor Memory Device and Methods of Fabricating the Same," U.S. Pat. No. 6,150,253, issued Nov. 21, 2000.

Problems have arisen in manufacturing such devices with very small dimensions, and with variations in process that meet tight specifications needed for large-scale memory devices. It is desirable therefore to provide a memory cell structure having small or reduced dimensions in elements such as an active region while decreasing a reset current, and a method for manufacturing such structure that meets tight process variation specifications needed for large-scale memory devices.

SUMMARY OF THE INVENTION

The present invention describes a programmable resistor memory, such as a phase change memory, with a memory element comprising narrow vertical side wall active pins. The side wall active pins comprise a programmable resistive material, such as a phase change material. In a first aspect of the invention, a method of forming a memory cell is described which comprises forming a stack comprising a first electrode having a principal surface (typically the top surface) with a perimeter, an insulating layer overlying a portion of the principal surface of the first electrode, and a second electrode vertically separated from the first electrode and overlying the insulating layer. Side walls on the insulating layer and on the second electrode are positioned over the principle surface of the first electrode with a lateral offset from the perimeter of the first electrode. In embodiments described herein, the second electrode comprises a bit line, a side wall active pin (or spacer) having a bottom surface in contact with the principal surface inside the perimeter of the first electrode, and a length that extends from the principal surface of the first electrode along the side wall of the insulating layer to the side wall of the second electrode. The side wall pin provides a memory element in electrical communication with the first and second electrodes.

The side wall active pin acting as the memory element is formed by etching a layer of programmable resistive material extending along the side wall of the insulating layer according to a pattern to define a width of a memory element. The width can be sublithographic in embodiments of the technology described herein. The memory element has a thickness determined by a thickness of the layer of programmable resistive material extending along the side wall of the insulating member, and a length between contacts to the first and second electrodes determined by a thickness of the layer of insulating material at the side wall of the layer of insulating material. The layer of programmable resistive material extending along the side wall of the insulating layer is formed by depositing a layer of programmable resistive material over the side wall of the stack, anisotropically etching the layer of programmable resistive material to remove it in areas away from the side wall. In embodiments described herein, the width is less than 50 nanometers, and more preferably about 40 nanometers or less.

Two exemplary embodiments of the side wall active pin in a memory cell are illustrated in the present invention. In a first embodiment, the memory cell has the side wall active pin on a side wall of an electrode stack that includes a first electrode, and a second electrode separated by an inter-electrode insulating layer from the first electrode. In the case of a programmable resistive material comprising a phase change material such as a chalcogenide, the size of the side wall active pin is minimized to reduce the electrical current needed to cause changes between a lower resistivity, generally crystalline state, and a higher resistivity, generally amorphous state.

In a second embodiment of the side wall active pin, a memory cell includes a side wall spacer having a side wall portion extending typically in a vertical direction, and a foot portion extending typically in a horizontal direction. A dielectric layer, preferably comprising a low thermal conductivity layer, like many of the low K (permittivity) materials, overlies the side wall spacer. The foot portion of the side wall spacer has a bottom surface in contact with a principal surface of a first electrode, and enhances the mechanical strength to support the side wall portion of the side wall spacer. The side wall portion of the side wall spacer extends along the side wall of an insulating member and a second electrode, in electrical communication with the first and second electrodes. In embodiments of the technology described herein, the second electrode comprises a bit line. The first electrode underlies the second electrode where the second electrode has an edge that has a lateral offset from an edge of the first electrode.

In a second aspect of the invention, a method of forming a memory cell is described that comprises forming a stack comprising a plug having a principal surface area with a perimeter, an insulating layer over at least a portion of the principal surface of the conductive plug, and an electrode over the insulating layer, with a side wall on at least the insulating layer of the stack. The principle surface area of the perimeter can be a wide variety of shapes, including a circular perimeter surface, a rectangular perimeter surface, or an area defined by the intersection of a plurality of sides. The electrode comprises a bit line, such as a metal bit line, in embodiments of the memory device described herein. A side wall active pin has a bottom surface in contact with the principal surface and a length that extends from the principal surface of the plug along the side wall of the insulating layer to the electrode.

Broadly stated, a memory device comprises a first electrode having a principal surface, the principle surface having a perimeter; a second electrode vertically separated from the first electrode and having a sidewall, at least a portion of the sidewall of the second electrode positioned over the principle surface with a lateral offset from the perimeter of the first electrode; an insulating member disposed between the first and second electrodes, the insulating member overlying at least a portion of the principal surface of the first electrode, the insulating member having a side wall, the sidewall of the insulating member positioned over the principle surface with a lateral offset from the perimeter of the first electrode; and a memory element comprising a programmable resistive material, the memory element having a side wall portion extending along the side wall of the insulating member and contacting the sidewall of the second electrode, the side wall portion of the memory element having a bottom surface in contact with the principal surface of the first electrode.

In order to selectively etch the programmable resistive material according to a pattern to define a side wall spacer with a sublithographic width, one technique includes forming an etch mask having a lithographic pattern to define a lithographic width, and then trimming the etch mask to provide a trimmed mask to define the pattern used for defining the width of the side wall spacer. In one example, the etch mask comprises a photoresist, which is etched anisotropically to form the trimmed mask using an oxygen based plasma etch. In another example, the etch mask comprises a hard mask defined using a lithographic process, which is etched to reduce its width to form the trimmed mask.

The three dimensions that define the size of the active region in the phase change pin for the cell described herein are preferably less than 50 nanometers, and can all be less than the minimum feature size of the lithographic process applied to make the cell. The dimensions are defined in technology described herein, by the thin film thickness of phase change material, the inter-electrode dielectric thin film thickness, and the trimmed mask. As a result, the cell size (the volume of the phase change material) is very small (smaller than $F^3$, where F is the minimum lithographic feature size for the process used to manufacture the memory cell). The resulting cell of phase change material comprises a narrow pin on the side wall of an electrode stack. The contact area between at least one of the top and bottom electrodes and the phase change material pin is also defined sub-lithographically by electrode layer thicknesses for the heights, and the photoresist pattern trimming process for the width of the contacts. The small cell and small contact region allow implementation of a memory with very small reset current and low power consumption.

The structures and methods of the present invention are disclosed in the detailed description below. This summary does not purport to define the invention. The invention is defined by the claims. These and other embodiments, features, aspects, and advantages of the technology can be understood with regard to the following description, appended claims and accompanying drawings.

BRIEF DESCRIPTION OF THE DRAWINGS

The invention will be described with respect to specific embodiments thereof and reference will be made to the drawings, in which:

FIGS. 8A-8B are process diagrams illustrating top and side views in a fourth step in the manufacturing of the phase change memory with the patterning of a metal and oxide bit line in accordance with the present invention.

FIGS. 9A-9B are process diagrams illustrating top and side views in a fifth step in the manufacturing of the phase change memory with a phase change material side wall deposition in accordance with the present invention.

FIGS. 10A-10B are process diagrams illustrating top and side views in a sixth step in the manufacturing of the phase change memory with a cell width photolithography in accordance with the present invention.

FIGS. 11A-11B are process diagrams illustrating top and side views in a seventh step in the manufacturing of the phase change memory with a cell width photolithography photoresist trimming in accordance with the present invention.

FIGS. 13A-13B are process diagrams illustrating top and side views in a ninth step in the manufacturing of the phase change memory with a photoresist removal in accordance with the present invention.

FIG. 14 is a perspective view illustrating a first embodiment of a side wall active pin in accordance with the present invention.

FIGS. 16A-16B are process diagrams illustrating top and side views in a first stage in the manufacturing of the second embodiment of the side wall active pin memory cell in the phase change memory with an oxide and GST spacer etching in accordance with the present invention.

FIGS. 17A-17B are process diagrams illustrating top and side views in a next step in the manufacturing of the second embodiment of the side wall active pin memory cell in the phase change memory with a cell width photolithography in accordance with the present invention.

FIG. 18 is a layout diagram of a structure illustrating bottom electrode members in accordance with the present invention.

DETAILED DESCRIPTION

Figure 1:
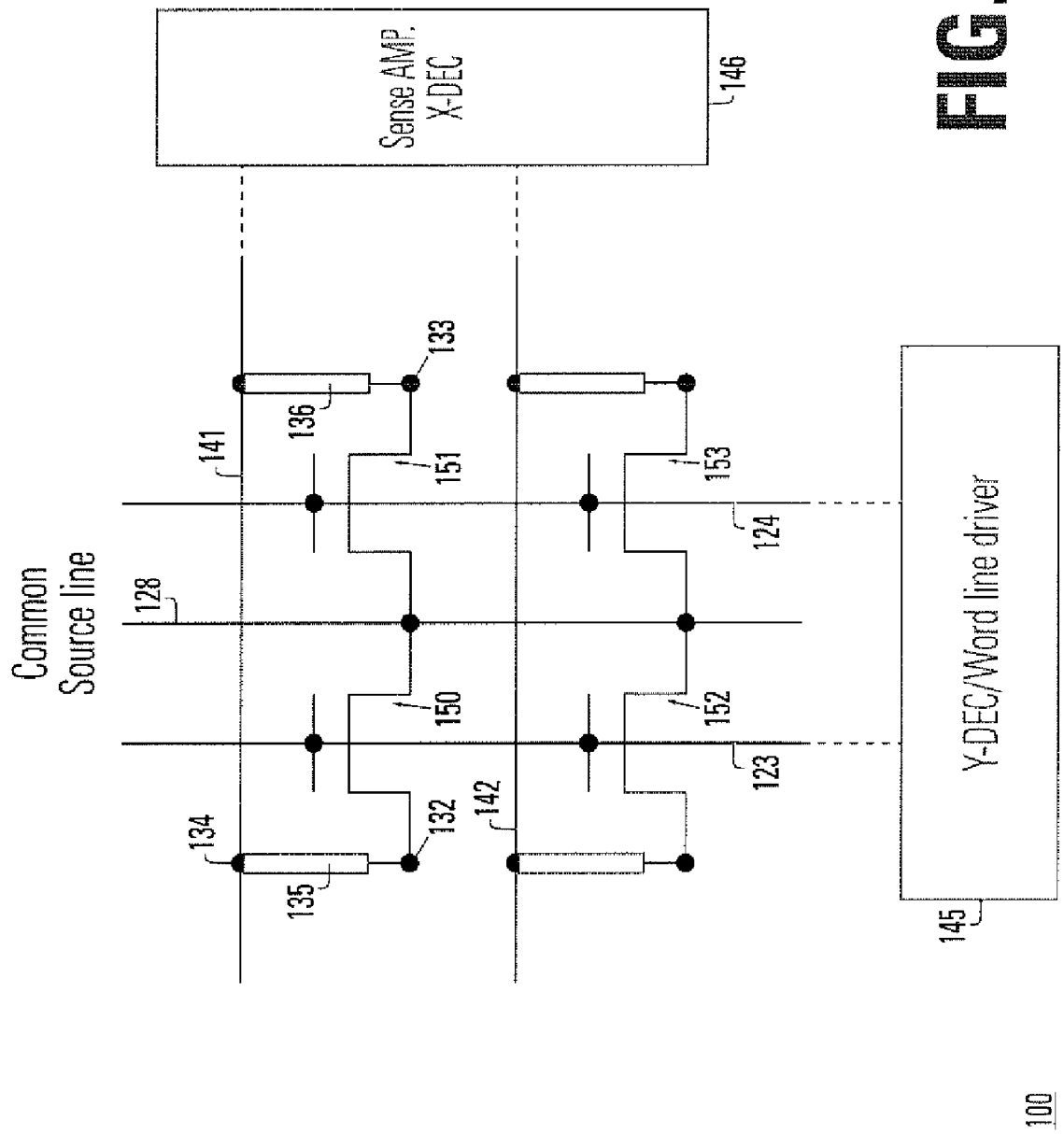
FIG. 1 is a simplified schematic diagram of a phase change memory array in accordance with the present invention.

A description of structural embodiments and methods of the present invention is provided with reference to FIGS. 1-21. It is to be understood that there is no intention of limiting the invention to the specifically disclosed embodiments, but that the invention may be practiced using other features, elements, methods and embodiments. Like elements in various embodiments are commonly referred to with like reference numerals.

Referring now to FIG. 1, there is shown a schematic illustration of a memory array 100, which can be implemented as described herein. In the schematic illustration of FIG. 1, a common source line 128, a word line 123 and a word line 124 are arranged generally parallel in the y-direction. Bit lines 141 and 142 are arranged generally parallel in the x-direction. Thus, a y-decoder and a word line driver in a block 145 are coupled to the word lines 123, 124. An x-decoder and a set of sense amplifiers in block 146 are coupled to the bit lines 141 and 142. The common source line 128 is coupled to the source terminals of access transistors 150, 151, 152 and 153. The gate of access transistor 150 is coupled to the word line 123. The gate of access transistor 151 is coupled to the word line 124. The gate of access transistor 152 is coupled to the word line 123. The gate of access transistor 153 is coupled to the word line 124. The drain of access transistor 150 is coupled to the bottom electrode member 132 for side wall pin memory cell 135, which has top electrode member 134 that comprises a side wall on bit line 141. Likewise, the drain of access transistor 151 is coupled to the bottom electrode member 133 for a side wall pin memory cell 136, which has a top electrode member that comprises a side wall on bit line 141. Access transistors 152 and 153 are coupled to corresponding side wall pin memory cells on bit line 142. It can be seen that the common source line 128 is shared by two rows of memory cells, where a row is arranged in the y-direction in the illustrated schematic. In other embodiments, the access transistors can be replaced by diodes, or other structures for controlling current flow to selected devices in the array for reading and writing data.

Figure 2:
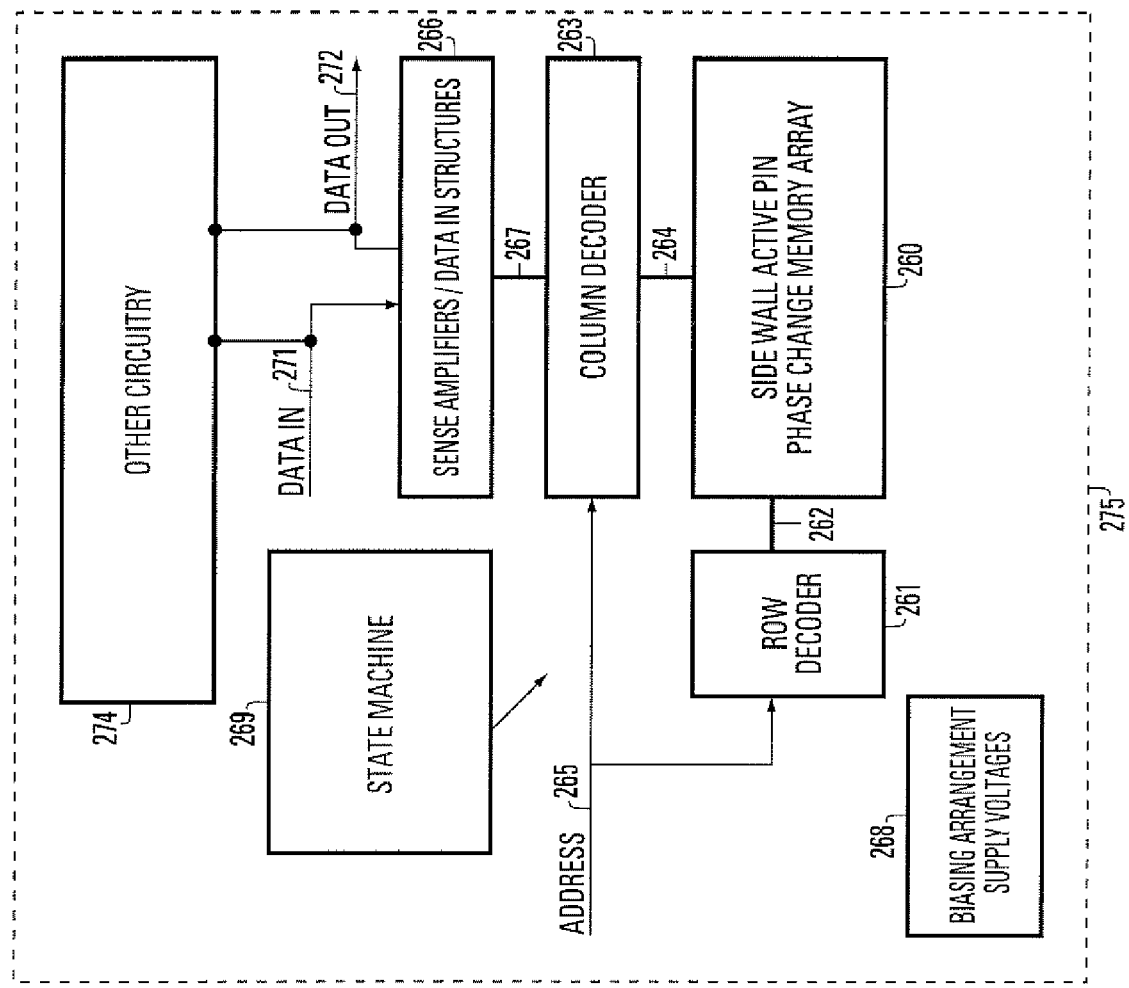
FIG. 2 is a simplified block diagram of an integrated circuit according to an embodiment of the present invention.

As illustrated in FIG. 2, there is shown a simplified block diagram of an integrated circuit according to an embodiment of the present invention. The integrated circuit 274 includes a memory array implemented using side wall active pin phase change memory cells on a semiconductor substrate. A row decoder 261 is coupled to a plurality of word lines 262, and arranged along rows in the memory array 260. A pin decoder 263 is coupled to a plurality of bit lines 264 arranged along pins in the memory array 260 for reading and programming data from the side wall pin memory cells in the memory array 260. Addresses are supplied on a bus 265 to a pin decoder 263 and the row decoder 261. Sense amplifiers and data-in structures in a block 266 are coupled to the pin decoder 263 via a data bus 267. Data is supplied via the data-in line 271 from input/output ports on the integrated circuit 275 or from other data sources internal or external to the integrated circuit 275, to the data-in structures in the block 266. In the illustrated embodiment, other circuitry is included on the integrated circuit, such as a general purpose processor or special purpose application circuitry, or a combination of modules providing system-on-a-chip functionality supported by the side wall active pin phase change memory cell array. Data is supplied via the data-out line 272 from the sense amplifiers in block 266 to input/output ports on the integrated circuit 275, or to other data destinations internal or external to the integrated circuit 275.

A controller implemented in this example using bias arrangement state machine 269 controls the application of bias arrangement supply voltages 268, such as read, program, erase, erase verify and program verify voltages. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may he utilized for implementation of the controller.

Figure 3:
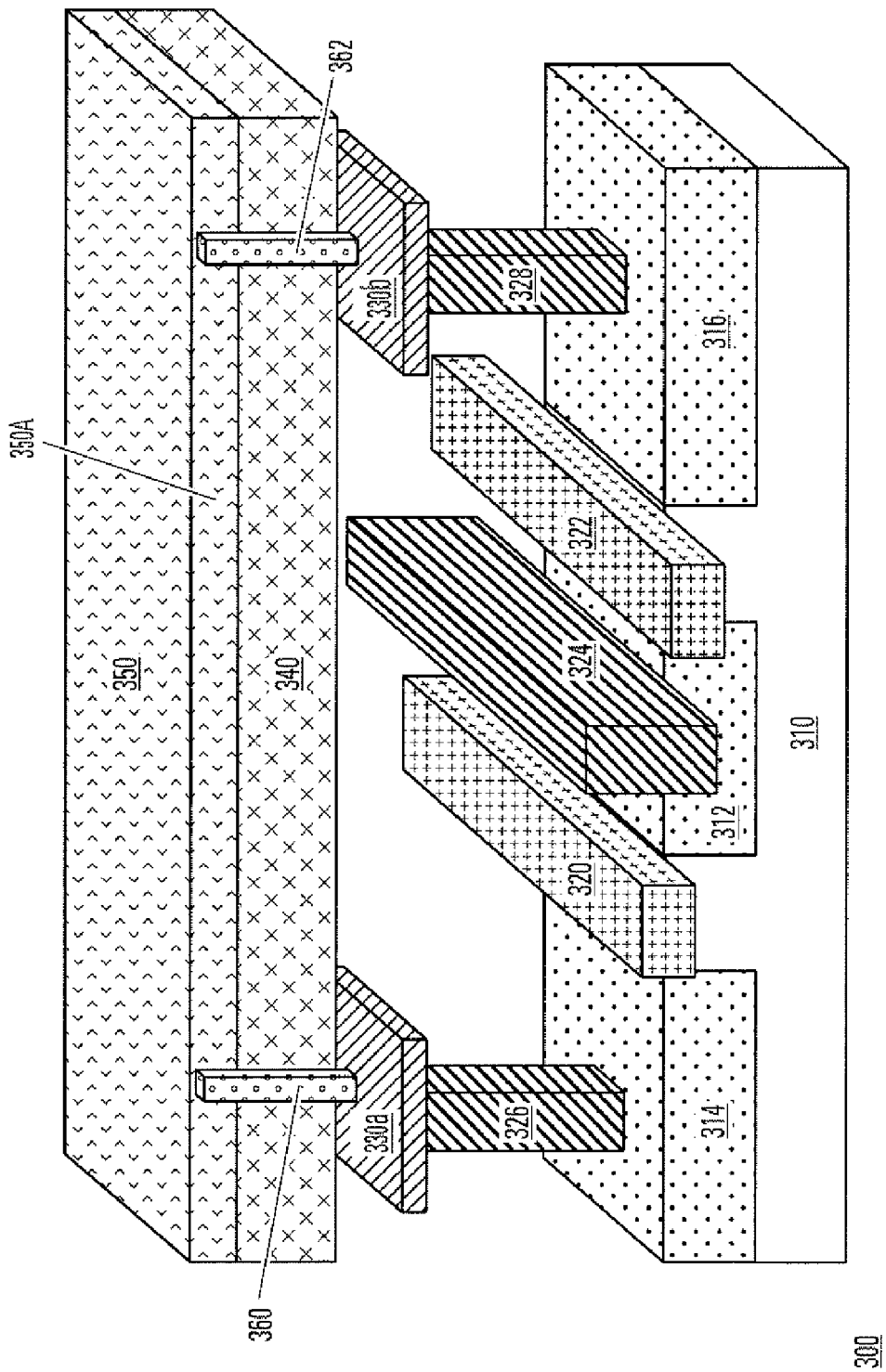
FIG. 3 is a perspective diagram illustrating a cross-sectional view of a phase change memory in a first embodiment in accordance with the present invention.

FIG. 3 is a perspective view of a phase change memory 300 in accordance with a first embodiment of the present invention. The phase change memory 300 is formed on a semiconductor substrate 310. Access transistors are formed by an n-type terminal 312 acting as a common source region and n-type terminals 314, 316 acting as drain regions in the p-type substrate 310. Polysilicon word lines 320 and 322 form the gates of the access transistors. An insulating layer (not illustrated) is formed over the polysilicon word lines. The layer is patterned and conductive structures, including common source line 324 and plug structures 326, 328, are formed. The conductive material can be tungsten or other materials and combinations suitable for the plug and lines structures. The common source line 324 contacts the source region, and acts as a common source line along a row in the array. The plug structures 326, 328 contact the drain terminals 314, 316, respectively. The fill layer (not shown), the common source line 324 and the plug structures 326, 328, have a generally planar top surface, suitable for formation of electrode members 330a and 330b (first and second bottom electrodes). The electrode members 330a and 330b are also referred to as bottom electrodes in the phase change memory 300 of the phase change memory cells. The first bottom electrode member 330a has a perimeter on a top surface where the perimeter is defined by the intersection of a plurality of sides. Although the first electrode member 330a is shown with a rectangular perimeter on the top surface, alternative embodiments of the top surface include a generally circular perimeter, a square perimeter, or any desired perimeter shape. A suitable material for implementing the first and second electrodes 330a and 330b is titanium nitride, or other material selected for compatibility with the material of plugs 326, 328 and the phase change material in pins 360, 362.

An insulating layer 340 overlies top surfaces of the first and second bottom electrode members 330a and 330b. The insulating layer comprises one or more layers of silicon dioxide, a polyimide, silicon nitride or other dielectric fill material. In some embodiments, the fill layer comprises a relatively good insulator for heat as well as for electricity, providing thermal and electrical isolation for the pins 360, 362. The tungsten plugs 326, 328 contact the first and second bottom electrode members 330a and 330b. A bit line 350 in a patterned conductive layer overlies the insulating layer 340.

In a memory array structure, bit lines are generally partitioned into several sets of local bit lines (or global bit lines) that serve as control lines for transferring data during read and programming operations. The bit lines in the present invention can be implemented with the conductive layer 350 that comprises metal or other conductive materials. The conductive layer 350 is coupled to a plurality of memory cells in a single layer of conductive material, such as a patterned metal layer as commonly used for metallic interconnect layers in semiconductors. The structure of a bit line is defined by three dimensional parameters: a length, a width and a thickness. A side wall 350A along the length of the bit line 350 acts as a surface for coupling to pins 360, 362 of a plurality of memory cells. For example, the bit line 350 is coupled to 16, 32, 64, 128 or more pins in various embodiments of the technology. Each memory cell pin 360, 362 has side wall pin that is in contact with the surface on the side wall 350A of the bit line 350.

A first side wall pin 360 is in contact with a side wall of the insulating layer 340 and a side wall 350A of the conductive layer 350. The first bottom electrode member 330a has a principal surface with a plurality of sides. The first side wall pin 360 includes a bottom surface in contact with the principal surface and spaced away from the perimeter of the plurality of sides of the first bottom electrode member 330a. The first side wall pin 360 comprises a programmable resistive material in electrical communication with the first and second bottom electrode members 330a, 330b. A second side wall pin 362 includes a side wall that contacts with the side wall of the insulating layer 340 and the side wall 350A of the conductive layer 350, and a bottom surface in contact with a principle surface of the second bottom electrode member 330b.

Figure 4:
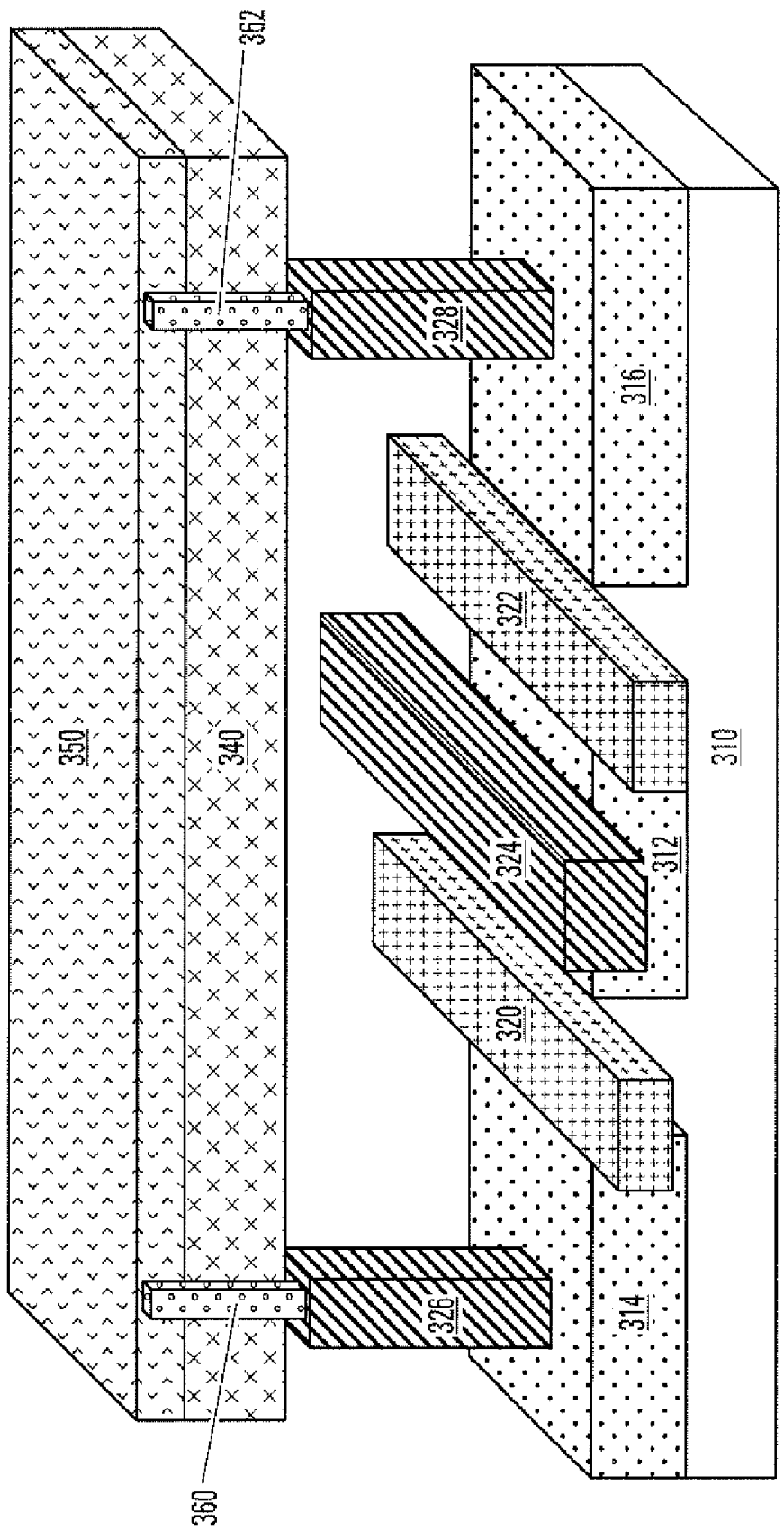
FIG. 4 is perspective diagram illustrating a cross-sectional view of a phase change memory in a second embodiment in accordance with the present invention.

FIG. 4 is a perspective view of a phase change memory 400 according to a second embodiment of the present invention. Each of the side wall pins 360 and 362 is directly in contact with top surfaces of plugs 326, 328, respectively, without the intermediate material of first and second bottom electrode members 330a and 330b. The bottom surface of the first side wall pin 360 is in contact with a top surface of the plug 326. The first side wall pin 360 comprises a programmable resistive material in electrical communication with the conductive layer 350 and the first plug 326.

A method for manufacturing the phase change memory 300 or 400 is discussed with reference to FIG. 5-17.

Figure 5:
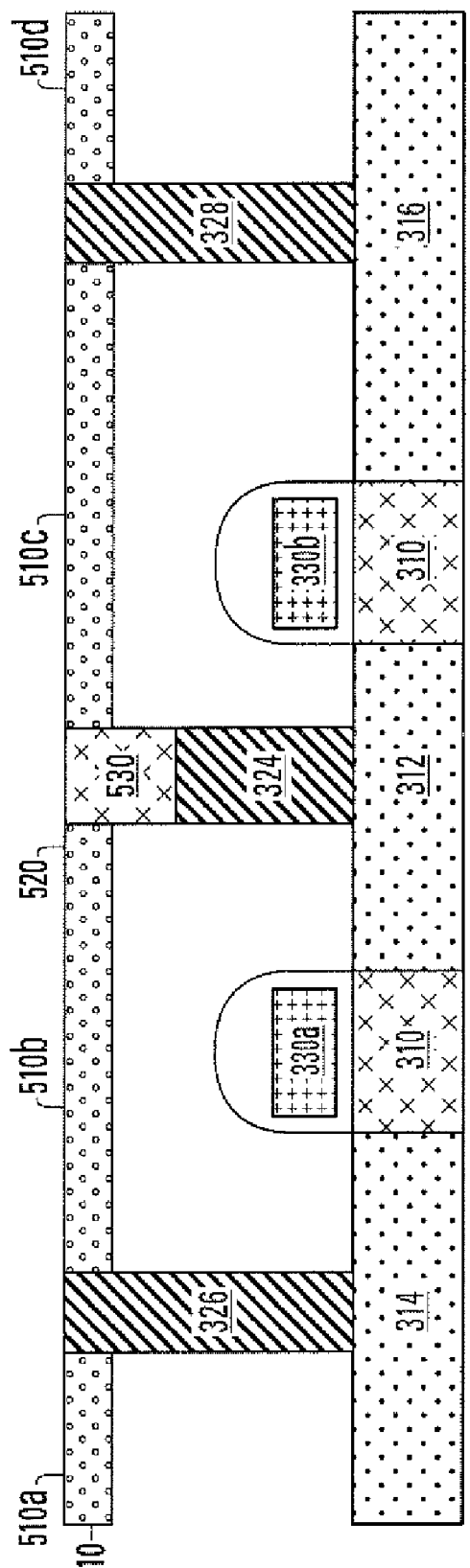
FIG. 5 is a process diagram illustrating a first step in the manufacturing of the phase change memory after completion of a front-end process for tungsten recess etching, oxide fill-in and chemical mechanical polishing in accordance with the present invention.

As shown in FIG. 5, there is a process diagram 500 illustrating a first stage in the manufacturing of the phase change memory 300 or 400 after completion of a front-end process for tungsten recess etching, oxide fill-in and polishing. The common source line 324 is formed between a top surface 520 of a silicon nitride layer 510 and the n-type terminal 312. In one embodiment, the thickness of the silicon nitride layer 510 is about 60 nm. The silicon nitride layer is divided into four segments 510a, 510b, 510c and 510d. A portion of the common source line 324 near a top surface is anisotropically etched to remove it from the top portion of the common source 324, and the etched region is filled in with a dielectric material 530. Thereafter the top surface 520 is subjected to polishing to make the top surface suitable for subsequent deposition of a memory cell layer. Embodiments of the process for polishing include a chemical mechanical polishing process, followed by brush clean and liquid and/or gas clean procedures, as known in the art.

Figure 6:
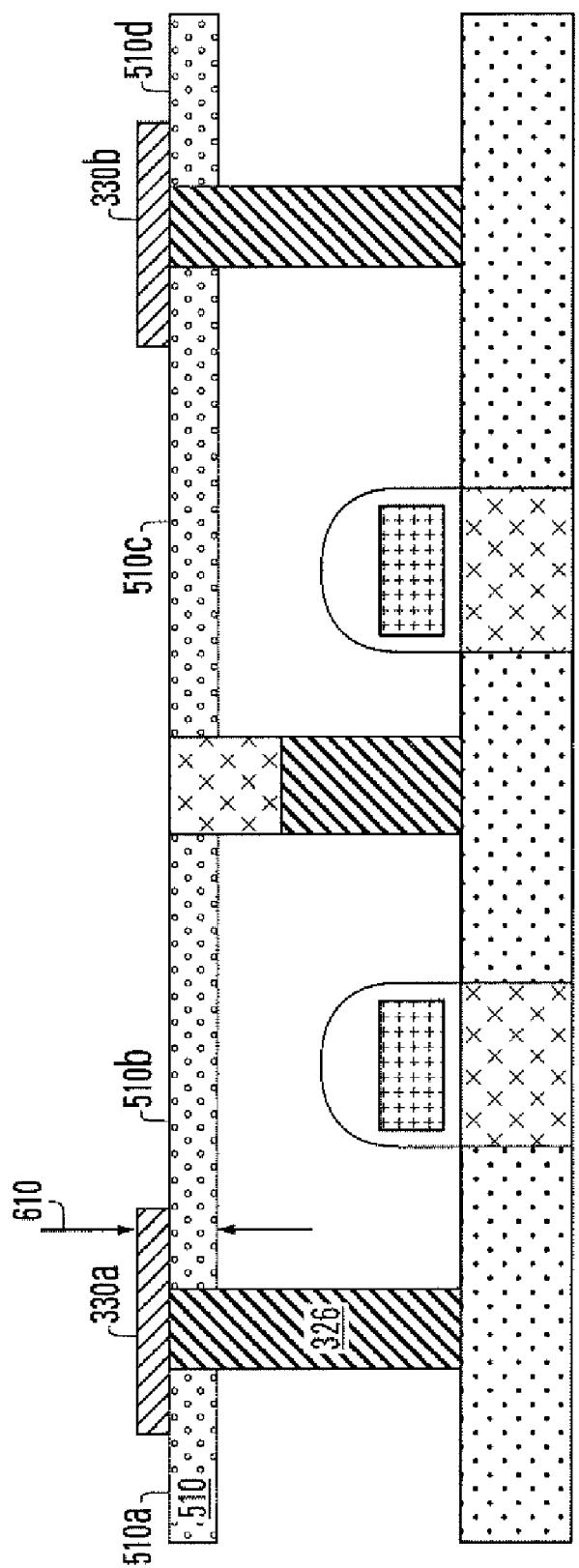
FIG. 6 is a process diagram illustrating a second step in the manufacturing of the phase change memory with the patterning of bottom electrode members in accordance with the present invention.

FIG. 6 is a process diagram 600 illustrating a second step in the manufacturing of the phase change memory with the patterning of bottom electrode members. The first bottom electrode member 330a is deposited and patterned over a portion of the first segment 510a, a top surface of the tungsten plug 326, and a portion of the second segment 510b. The second bottom electrode member 330b is deposited and patterned over a portion of the third segment 510c, a top surface of the tungsten plug 328, and a portion of the fourth segment 510d. In preferred embodiments, the electrode material of the first and second bottom electrode members 330a, 330b is deposited on the planarized surface of the silicon nitride layer 510. After depositing the first and second bottom electrode members 330a, 330b, the first and second bottom electrode members 330a, 330b are defined using lithographic masks and etching to form the electrode patterns. Some examples of suitable materials for implementing the first and second bottom electrodes 330a, 330b include TiN, W TaN, Ta and TiAlN. A suitable thickness 610 for each of the first and second and bottom electrode members 330a, 330b is about, for example, 60 nm, after planarization.

Figure 7:
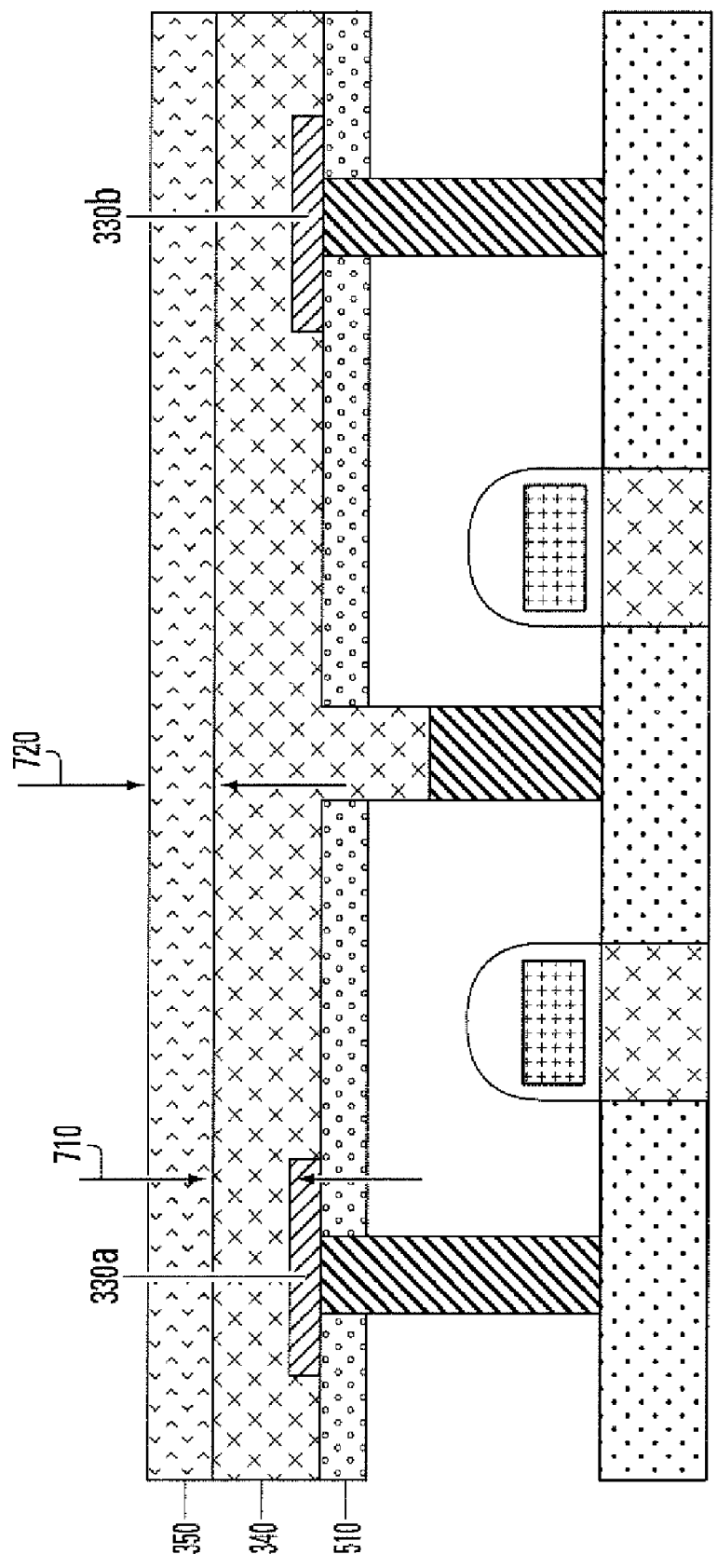
FIG. 7 is a process diagram illustrating a third step in the manufacturing of the phase change memory with silicon nitride, oxide, and metal deposition patterning in accordance with the present invention.

FIG. 7 is a process diagram 700 illustrating a third step in the manufacturing of the phase change memory with silicon nitride, oxide and metal deposition. The insulating layer 340 is deposited over the first bottom electrode member 330a, the second bottom electrode member 330b, and the silicon nitride layer 510. A suitable thickness 710 of the insulating layer 340 is about for example, 50 nm. The patterned conductive layer 350 overlies a top surface of the insulating layer 340. In one embodiment, a suitable thickness 720 of the patterned conductive layer 350 is about 60 nm.

The insulating layer 340 may include silicon oxide, silicon oxynitride, silicon nitride, $Al_2O_3$, other low K (low permittivity) dielectrics, or an ONO or SONO multi-layer structure. The term "low K" means low permittivity. Alternatively, the fill may comprise an electrical insulator including one or more elements selected from the group consisting of Si, F, N, O, and C. In devices in which the dielectric layer 340 comprises silicon dioxide, the fill has a thermal conductivity value "kappa" of less than that of silicon dioxide which is 0.014 J/cm*K*sec. In other preferred embodiments, the thermal insulator has a thermal conductivity less than that of the amorphous state of the phase change material, or less than about 0.003 J/cm*K*sec for a phase change material comprising GST. Representative materials for thermal insulator 340 include low permittivity (low-K) materials, including materials that are a combination of the elements silicon Si, carbon C, oxygen O, fluorine F, and hydrogen H. Examples of thermally insulating materials which are candidates for use as thermal insulator 340 include SiCOH, polyimide, polyamide, and fluorocarbon polymers. Other examples of materials which are candidates for use for thermal insulator 340 include fluorinated SiO2, silsesquioxane, polyarylene ethers, parylene, fluoropolymers, fluorinated amorphous carbon, diamond like carbon, porous silica, mesoporous silica, porous silsesquioxane, porous polyimide, and porous polyarylene ethers. In other embodiments, the thermally insulating structure comprises a gas-filled void lining the walls of via. A single layer or combination of layers can provide thermal insulation.

FIGS. 8A-8B include process diagrams 800, 850 illustrating top and side views in a fourth step in the manufacturing of the phase change memory with a metal and oxide bit line patterning. The conductive layer 350 and the insulating layer 340 are patterned in the y-direction such that the side walls 830, 820 of the conductive layer 350 and the insulating layer 340 are substantially perpendicular to the top surfaces of the first and second bottom electrodes 330a, 330b. In some embodiments, the side walls may be sloped, stepped, offset from one another or assume other vertical aspects. The top surfaces of the first and second bottom electrodes 330a, 330b protrude from beneath the side walls 820, 830 of the insulating layer 340 and the conductive layer 350. The first bottom electrode member 330a comprises a rectangular or square shape having a perimeter that includes a side 330as that is spaced away by the distance y as indicated by annotation 810 from side walls 820, 830 on the insulating layer 340 and the conductive layer 350. The second bottom electrode member 330b comprises a rectangular or square shape having a perimeter that includes a side 330bs that is spaced away by the distance y as indicated by annotation 810 from a side wall on the insulating layer 340 and the conductive layer 350.

FIGS. 9A-9B include process diagrams 900, 950 illustrating top and side views in a fifth step in the manufacturing of the phase change memory with a phase change material side wall deposition. The structure shown results from depositing a layer of the programmable resistive material over the side wall, and anisotropically etching the layer of programmable resistive material to leave a layer of programmable resistive material extending along the side walls of the insulating member and contacting the sidewalls 830, 910, 920 and 930 of the second electrode 350, and having a bottom surface in contact with the principal surface of the first electrode. The conductive layer 350 formed over the insulating layer 340 has four side walls 830, 910, 920 and 930 that extend downward to each side wall of the insulating layer 340. A phase change material 940 is deposited around the side walls of the insulating layer 340 and the conductive layer 350, and makes contact with the top surfaces of the first and second bottom electrode members 330a, 330b. In one embodiment, the thickness of the phase change material 940 on the side walls is about 20 nm.

FIGS. 10A-10B include process diagrams 1000, 1050 illustrating top and side views in a sixth step in the manufacturing of the phase change memory with cell width photolithography. Photolithography is used to make photoresist masks 1010, 1020 to define a width of phase change side wall pins 360, 362. The photoresist masks 1010, 1020 harden when developed to define a cell width that is subsequently used to create phase change side wall pins 360, 362. Each of the photoresist masks 1010, 1020 has a height 1030 that extends above the top surface of the conductive layer 350 and overlies the layer of phase change material 940 on the side walls of the insulating layer 340 and the conductive layer 350.

FIGS. 11A-11B include process diagrams 1100, 1150 illustrating top and side views in a seventh step in the manufacturing of the phase change memory with cell width photoresist mask trimming to form more narrow photoresist strips 1110, 1120. In one embodiment, the photoresist strips 1110, 1120 are trimmed by isotropic etching. The etching trims the photoresist strips to more narrow line widths. Embodiments of the more narrow photoresist strips 1110, 1120 are less than 100 nm wide. In other embodiments, the more narrow photoresist strips 1110, 1120 are about 40 nm or less wide. Photoresist trimming is applied using an oxide plasma to isotropically etch the photoresist, which trims its width and thickness to a width/thickness of, for example, about 40 nm in a 0.09 micron (90 nanometer) minimum feature size lithographic process environment. The narrow photoresist strips 1110, 1120 have a first dimension 1130 which corresponds to a width. The first dimension 1130, in this embodiment about 40 nm, is well below the minimum photolithographic feature size used to create the mask. The first dimension 1130 is preferably about 10 to 50 nm and more preferably no more than about 40 nm.

Figure 12A:
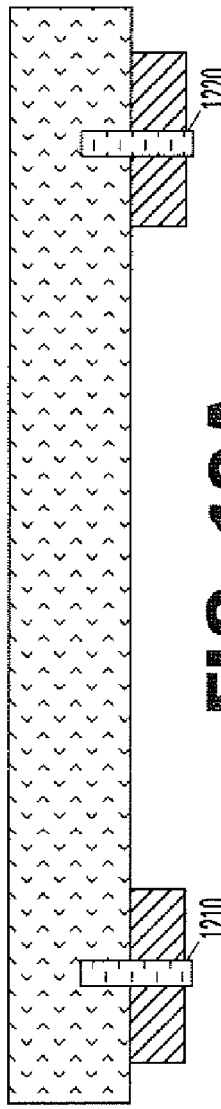
FIGS. 12A-12B are process diagrams illustrating top and side views in an eighth step in the manufacturing of the phase change memory with a side wall phase change material etching in accordance with the present invention.
Figure 12B:
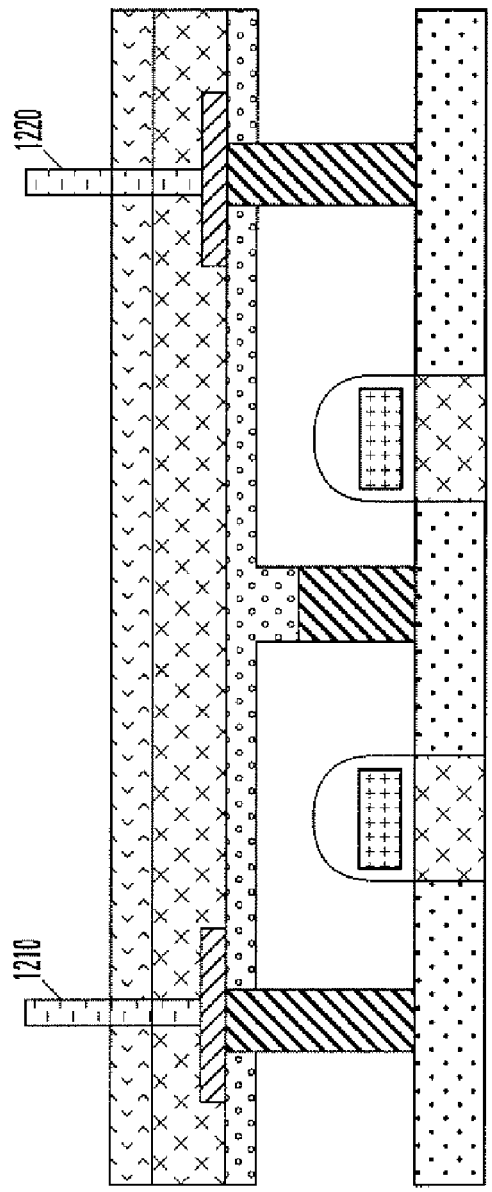

FIGS. 12A-12B include process diagrams 1200, 1250 illustrating top and side views in an eighth step in the manufacturing of the phase change memory with side wall phase change material etching. The phase change material 940 that surrounds side walls of the conductive layer 350 and the insulating layer 340 is anisotropically etched in areas other than the areas covered by the photoresists 1210, 1220. The phase change material etch may be a single anisotropic etch.

FIGS. 13A-13B include process diagrams 1300, 1350 illustrating top and side views in a ninth step in the manufacturing of the phase change memory with photoresist removal. The photoresist masks 1210 and 1220 are removed, leaving phase memory pins 360, 362 that extend along a side wall of the dielectric layer 340 and a side wall of the conductive layer 350.

FIG. 14 is a perspective view of a side wall active pin memory cell 1400. The cell 1400 includes a narrow side wall spacer, referred to as the side wall pin 360 (or 362) on a side wall of an electrode stack that includes a bottom electrode 366, and a top electrode 367 separated by an inter-electrode dielectric layer 368 from the bottom electrode 366. The size of the phase change pins 360 is minimized to reduce the current needed to cause a change between a lower resistivity, generally crystalline state and a higher resistivity, generally amorphous state. The pin 360 comprises a programmable resistive material, such as a phase change material. The pin 360 has an active region, within which the phase change is confined, with a length L between the first electrode 366 and the second electrode 367 which is determined by the thickness of the inter-electrode dielectric layer 368. The active region of the pin 360 has a thickness T determined by the thickness of a thin film formed on the side wall of the electrode stack. The electrode stack can be made using a photolithographic process or other type of lithographic process so that its width is about equal to the minimum feature size specified for the lithographic process. For advanced lithographic processes the width W of the electrode stack may be on the order of 90 nanometers. The active region of the pin 360 has a width which is less than the minimum feature size for the lithographic process used to define the electrode stack. In embodiments described herein, the width of the active region of the pin 360 is about 40 nanometers or less.

As illustrated, the active region of the pin 360 has a length L defined by a thin film thickness of the inter-electrode dielectric 368, which in embodiments of the invention can range between about 20 and 50 nanometers. Likewise, the active region of the pin 360 has a thickness T which is defined by the thin film thickness of the material used to form the side wall pin, which in embodiments of the invention can range between about 10 and 50 nanometers. Accordingly, all three dimensions of the pin 360 are sub-lithographic, and less than 50 nanometers in embodiments of the present invention, and more preferably about 40 or less nanometers.

Phase change alloys can be switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

Embodiments of the memory cell include phase change based memory materials, including chalcogenide based materials and other materials, for the side wall pins 360, 362. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from pin six of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, Tn/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky '112 patent, cols 10-11.) Particular alloys evaluated by another researcher include $Ge_2Sb_2Te_5$, $GeSb_2Te_4$ and $GeSb_4Te_7$. (Noboru Yamada, "Potential of Ge-Sb-Te Phase-Change Optical Disks for High-Data-Rate Recording", *SPIE* v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at pins 11-13, which examples are hereby incorporated by reference.

Other programmable resistive memory materials may be used in other embodiments of the invention, including $N_2$ doped GST, $Ge_xSb_y$, or other material that uses different crystal phase changes to determine resistance; $Pr_xCa_yMnO_3$, PrSrMnO, ZrOx, or other material that uses an electrical pulse to change the resistance state; 7,7,8,8-tetracyanoquinodimethane (TCNQ), methanofullerene 6,6-phenyl C61-butyric acid methyl ester (PCBM), TCNQ-PCBM, Cu-TCNQ, Ag-TCNQ, C60-TCNQ, TCNQ doped with other metal, or any other polymer material that has bistable or multi-stable resistance state controlled by an electrical pulse.

The following are short summaries describing four types of resistive memory materials. The first type is chalcogenide material, such as $Ge_xSb_yTe_z$ where x:y:z=2:2:5, or other compositions with x: 0~5; y: 0~5; z: 0~10. GeSbTe with doping, such as N—, Si—, Ti—, or other element doping is alternatively used.

An exemplary method for forming chalcogenide material uses PVD-sputtering or magnetron-sputtering method with source gas(es) of Ar, $N_2$, and/or He, etc. at the pressure of 1 mTorr~100 mTorr. The deposition is usually done at room temperature. A collimator with an aspect ratio of 1~5 can be used to improve the fill-in performance. To improve the fill-in performance, a DC bias of several tens of volts to several hundreds of volts is also used. On the other hand, the combination of DC bias and the collimator can be used simultaneously.

A post-deposition annealing treatment in vacuum or in an $N_2$ ambient is optionally performed to improve the crystallize state of chalcogenide material. The annealing temperature typically ranges from 100° C. to 400° C. with an anneal time of less than 30 minutes.

The thickness of chalcogenide material depends on the design of cell structure. In general, a chalcogenide material with thickness of higher than 8 nm can have a phase change characterization so that the material exhibits at least two stable resistance states.

A second type of memory material suitable for use in embodiments is colossal magnetoresistance ("CMR") material , such as $Pr_xCa_yMnO_3$ where x:y=0.5:0.5, or other compositions with x: 0~1; y: 0~1. CMR material that includes Mn oxide is alternatively used.

An exemplary method for forming CMR material uses PVD sputtering or magnetron-sputtering method with source gases of Ar, $N_2$, $O_2$, and/or He, etc. at the pressure of 1 mTorr~100 mTorr. The deposition temperature can range from room temperature to ~600° C., depending on the post deposition treatment condition. A collimator with an aspect ratio of 1~5 can be used to improve the fill-in performance. To improve the fill-in performance, the DC bias of several tens of volts to several hundreds of volts is also used. On the other hand, the combination of DC bias and the collimator can be used simultaneously. A magnetic field of several tens of Gauss to as much as a Tesla (10,000 Gauss) may be applied to improve the magnetic crystallized phase.

A post-deposition annealing treatment in vacuum or in an $N_2$ ambient or $O_2/N_2$ mixed ambient is optionally used to improve the crystallized state of CMR material. The annealing temperature typically ranges from 400° C. to 600° C. with an anneal time of less than 2 hours.

The thickness of CMR material depends on the design of the cell structure. The CMR thickness of 10 nm to 200 nm can be used for the core material. A buffer layer of YBCO ($YBaCuO_3$, which is a type of high temperature superconductor material) is often used to improve the crystallized state of CMR material. The YBCO is deposited before the deposition of CMR material. The thickness of YBCO ranges from 30 nm to 200 nm.

A third type of memory material is two-element compounds, such as $Ni_xO_y$; $Ti_xO_y$; $Al_xO_y$; $W_xO_y$; $Zn_xO_y$; $Zr_xO_y$; $Cu_xO_y$; etc, where x:y=0.5:0.5, or other compositions with x: 0~1; y: 0~1. An exemplary formation method uses a PVD sputtering or magnetron-sputtering method with reactive gases of Ar, $N_2$, $O_2$, and/or He, etc. at the pressure of 1 mTorr~100 mTorr, using a target of metal oxide, such as $Ni_xO_y$; $Ti_xO_y$; $Al_xO_y$; $W_xO_y$; $Zn_xO_y$; $Zr_xO_y$; $Cu_xO_y$; etc. The deposition is usually performed at room temperature. A collimator with an aspect ratio of 1~5 can be used to improve the fill-in performance. To improve the fill-in performance, the DC bias of several tens of volts to several hundreds of volts is also used. If desired, the combination of DC bias and the collimator can be used simultaneously.

A post-deposition annealing treatment in vacuum or in an $N_2$ ambient or $O_2/N_2$ mixed ambient is optionally performed to improve the oxygen distribution of metal oxide. The annealing temperature ranges from 400° C. to 600° C. with an anneal time of less than 2 hours.

An alternative formation method uses a PVD sputtering or magnetron-sputtering method with reactive gases of $Ar/O_2$, $Ar/N_2/O_2$, pure $O_2$, $He/O_2$, $He/N_2/O_2$ etc. at the pressure of 1 mTorr~100 mTorr, using a target of metal oxide, such as Ni, Ti, Al, W, Zn, Zr, or Cu etc. The deposition is usually performed at room temperature. A collimator with an aspect ratio of 1~5 can be used to improve the fill-in performance. To improve the fill-in performance, a DC bias of several tens of volts to several hundreds of volts is also used. If desired, the combination of DC bias and the collimator can be used simultaneously.

A post-deposition annealing treatment in vacuum or in an $N_2$ ambient or $O_2/N_2$ mixed ambient is optionally performed to improve the oxygen distribution of metal oxide. The annealing temperature ranges from 400° C. to 600° C. with an anneal time of less than 2 hours.

Yet another formation method uses oxidation by a high temperature oxidation system, such as a furnace or a rapid thermal pulse ("RTP") system. The temperature ranges from 200° C. to 700° C. with pure $O_2$ or $N_2/O_2$ mixed gas at a pressure of several mTorr to 1 atm. The time can range several minute to hours. Another oxidation method is plasma oxidation. An RF or a DC source plasma with pure $O_2$ or $Ar/O_2$ mixed gas or $Ar/N_2/O_2$ mixed gas at a pressure of 1 mTorr to 100 mTorr is used to oxidize the surface of metal, such as Ni, Ti, Al, W, Zn, Zr, or Cu etc. The oxidation time ranges several seconds to several minutes. The oxidation temperature ranges from room temperature to 300° C., depending on the degree of plasma oxidation.

A fourth type of memory material is a polymer material, such as TCNQ with doping of Cu, $C_{60}$, Ag etc. or PCBM-TCNQ mixed polymer. One formation method uses evaporation by thermal evaporation, e-beam evaporation, or molecular beam epitaxy ("MBE") system. A solid-state TCNQ and dopant pellets are co-evaporated in a single chamber. The solid-state TCNQ and dopant pellets are put in a W-boat or a Ta-boat or a ceramic boat. A high electrical current or an electron-beam is applied to melt the source so that the materials are mixed and deposited on wafers. There are no reactive chemistries or gases. The deposition is performed at a pressure of $10^{-4}$ Torr to $10^{-10}$ Torr. The wafer temperature ranges from room temperature to 200° C.

A post-deposition annealing treatment in vacuum or in an $N_2$ ambient is optionally performed to improve the composition distribution of polymer material. The annealing temperature ranges from room temperature to 300° C. with an anneal time of less than 1 hour.

Another technique for forming a layer of polymer-based memory material is to use a spin-coater with doped-TCNQ solution at a rotation of less than 1000 rpm. After spin-coating, the wafer held (typically at room temperature or temperature less than 200° C.) for a time sufficient for solid-state formation. The hold time ranges from several minutes to days, depending on the temperature and on the formation conditions.

Phase change materials can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined empirically, without undue experimentation, specifically adapted to a particular phase change alloy.

The phase change material is referred to as GST, and it will be understood that other types of phase change materials can be used. A material useful for implementation of a memory cell as described herein is $Ge_2Sb_2Te_5$.

Useful characteristics of the programmable resistive material, like a phase change material, include the material having a resistance which is programmable, and preferably in a reversible manner, such as by having at least two solid phases that can be reversibly induced by electrical current, These at least two phases include an amorphous phase and a crystalline phase. However, in operation, the programmable resistive material may not be fully converted to either an amorphous or crystalline phase. Intermediate phases or mixtures of phases may have a detectable difference in material characteristics. The two solid phases should generally be bistable and have different electrical properties. The programmable resistive material may be a chalcogenide material. A chalcogenide material may include GST. Alternatively, it may be one of the other phase change materials identified above.

Figure 15:
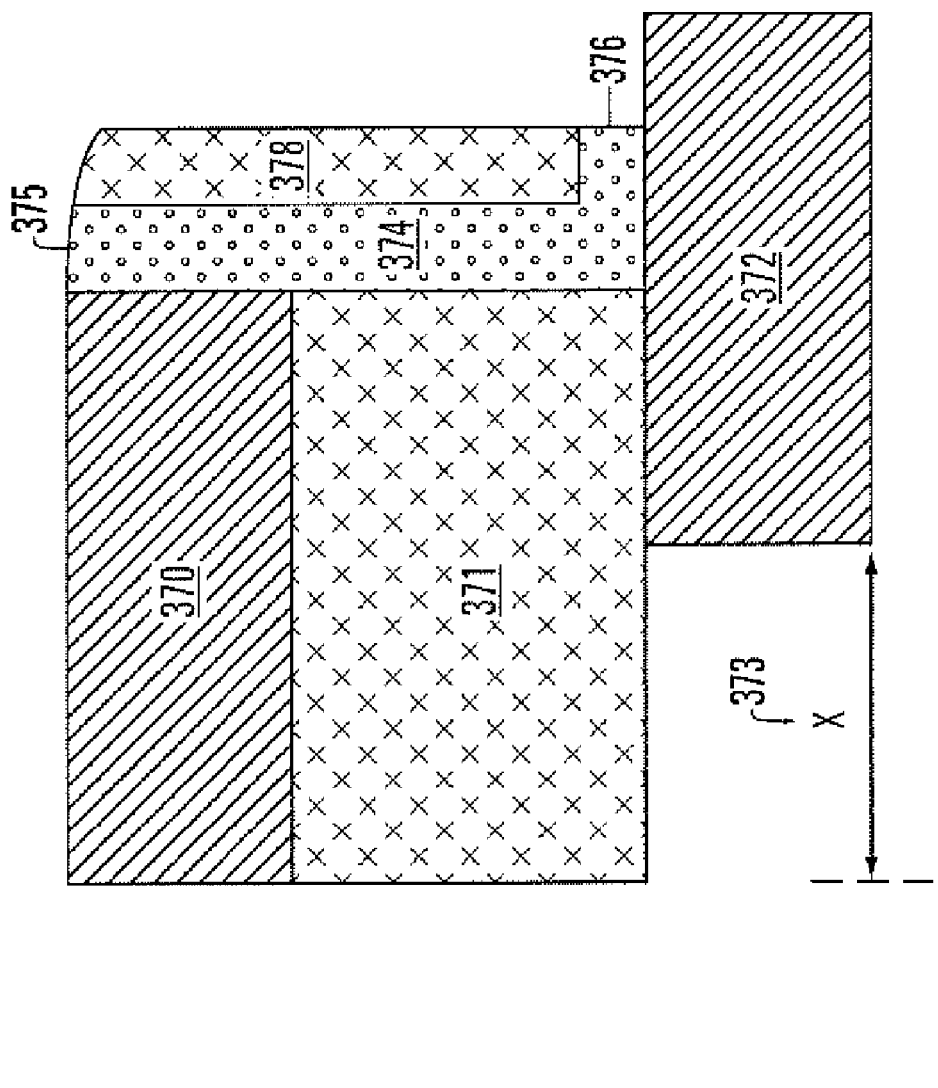
FIG. 15 is a perspective view illustrating a second embodiment of the side wall active pin in accordance with the present invention.

Turning now to FIG. 15, there is a perspective view illustrating a second embodiment of the side wall active pin memory cell 1500 for implementation of the side wall pins 360, 362 in the phase change memory 300 or 400. The side wall active pin memory cell 1500 includes a top electrode 370 and a bottom electrode 372 in which there is a lateral offset X 373 measured from the left edge (electrode edge) of the top electrode 370 to the left edge (electrode edge) of the bottom electrode 372. The bottom electrode has a perimeter on a principal surface. An inter-electrode dielectric layer 371 is placed between the top electrode 370 and the bottom electrode 372. The cell 1500 also includes a side wall spacer 374 and a dielectric layer 371. In this embodiment, the side wall spacer 374 resembles an L-like shape with a side wall portion 375 extending typically in the vertical direction and a foot portion 376 extending typically in the horizontal direction. The foot portion 376 improves the mechanical strength of the overall structure of the side wall spacer 374 by expanding the base of the side wall spacer 374 to aid the support of the vertical portion 375. The foot portion 376 has a bottom surface in contact with the principal surface and preferably inside the perimeter of the bottom electrode 372. The side wall spacer 374 comprises a programmable resistive material spacer that provides an electrical communication with the first and second electrodes 370, 372. A side wall of the programmable resistive material spacer is in contact and along a side wall on inter-electrode dielectric layer 371 and a side wall of the top electrode 370. A dielectric layer 378, preferably comprising a low K material or a low thermal conductivity material having a thermal conductivity less than that of the programmable resistive material in its higher resistivity state, overlies the side wall spacer 374 including the side wall portion 375 and the foot portion 376 to serve as an etch protection layer.

To manufacture the structure of FIG. 15, the process flow prior to FIGS. 9A and 9B is modified by depositing a layer of second material over the layer of programmable resistive material prior to anisotropically etching the layer of programmable resistive material, and anisotropically etching the layer of second material and the layer of programmable resistive material to leave a layer of programmable resistive material and a layer of the second material extending along the side wall of the insulating member. The second material comprises an oxide protective layer deposited overlying substantially both the top and sides of the programmable resistive memory material layer in the illustrated embodiment. The oxide protective layer serves as a protective layer over the programmable resistive memory material. Some suitable materials to implement the oxide protective layer 378 include silicon oxide, silicon oxynitride, silicon nitride, Al$_2$O$_3$, other low K (low permittivity) dielectrics, or an ONO or SONOS multi-layer structure.

FIGS. 16A-16B include process diagrams 1600, 1650 illustrating top and side views in a first stage in the manufacturing of the second embodiment after anisotropically etching the an oxide protective layer and the programmable resistive memory material layer, The programmable resistive memory material spacer 1611 and the oxide protective layer spacer 1711 etching may be a single anisotropic etch for both the programmable resistive memory spacer 1611 and the oxide protective layer spacer 1711 or a two-step process first etching the oxide protective layer 1711 with a first etch chemistry, and second etching the programmable resistive memory 1611 with a second etch chemistry.

FIGS. 17A-17B include process diagrams 1700, 1750 illustrating top and side views in a next step in the manufacturing of the second embodiment of the side wall active pin memory cell in the phase change memory with a cell width photolithography. Photolithography is used to make photoresist masks 1710, 1720. The photoresist masks 1710, 1720 harden when developed to define a cell width that is subsequently used to create phase change side wall pins 360, 362. Each of the photoresist masks 1710, 1720 has a height 1730 that extends above the top surface of the conductive layer 350 and overlies the side walls on the insulating layer and the conductive layer as described above. The process proceeds to completion of the cells as described above.

FIGS. 18-21 illustrate stages in the manufacturing process from layout perspective. FIG. 18 depicts a layout diagram 1800 of four cell pairs 1801, 1802, 1803 and 1804. With reference to cell pair 1801, the active region 305 is used for formation of the doped regions 314, 316, as illustrated in FIG. 3. In the embodiment shown, the width of the active region 305 is about 0.4 microns. Also, the layout of the polysilicon lines 320, 322 is shown for formation of the word lines as shown in FIG. 3. The polysilicon lines 320, 322 intersect the active region 305, and are typically formed before implantation of the doping material. The width of the polysilicon lines 320, 322 is about 0.18 microns in the embodiment illustrated. The access transistors which result have a transistor width of about 0.4 microns, and a transistor length of about 0.18 microns in this example. Also shown in FIG. 18 is the layout of the tungsten common source line 324, and contact plugs 326, 328, used for formation of the common source line 324, and the plugs 326, 328 of FIG. 3. In the illustrated embodiment, the common source line 324 is about 0.2 microns wide, and the tungsten plugs are about 0.2 microns in diameter. The tungsten plugs 326, 328 are placed about 0.1 microns from the edges of the active region 305, and about 0.16 microns from the side of the polysilicon lines 320, 322. The distance between the polysilicon lines 320, 322 and the common source line 324 is about 0.16 microns in the illustrated embodiment. The first and second bottom electrodes 330a, 330b are shown above the plugs 326, 328

Figure 19:
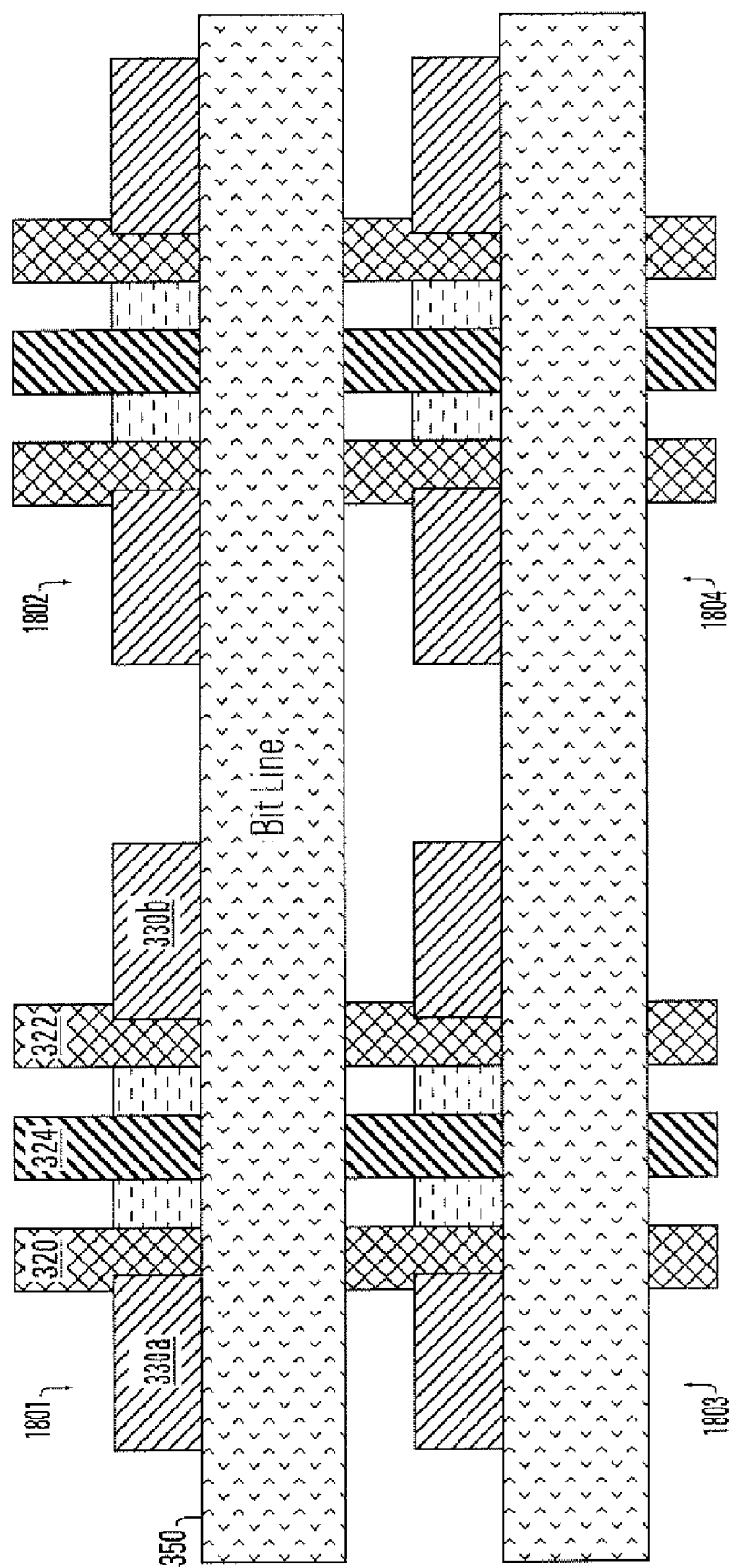
FIG. 19 is a layout diagram of a structure illustrating bit lines in accordance with the present invention.
Figure 20:
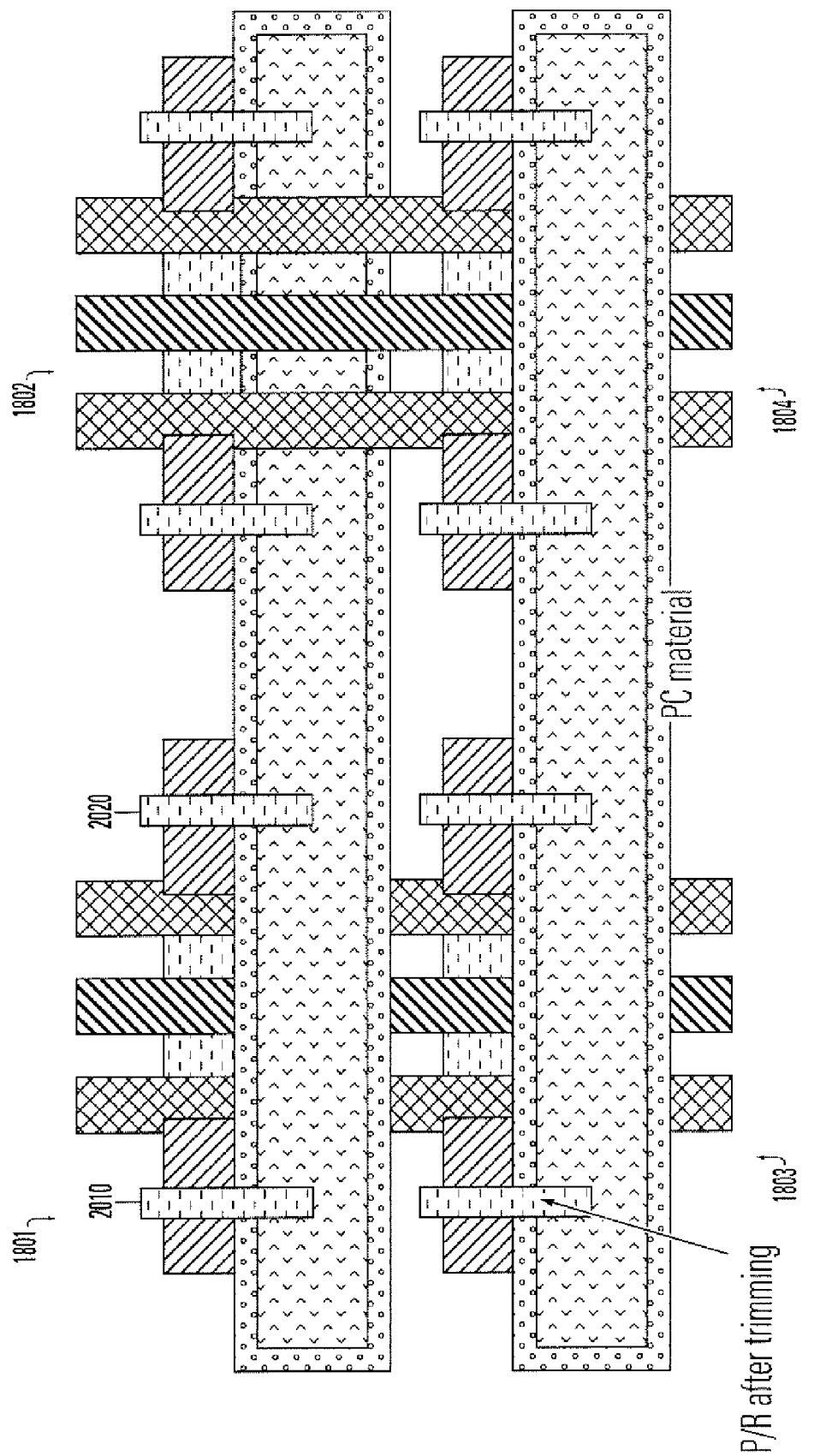
FIG. 20 is a layout diagram of a structure illustrating photoresist after trimming in accordance with the present invention.
Figure 21:
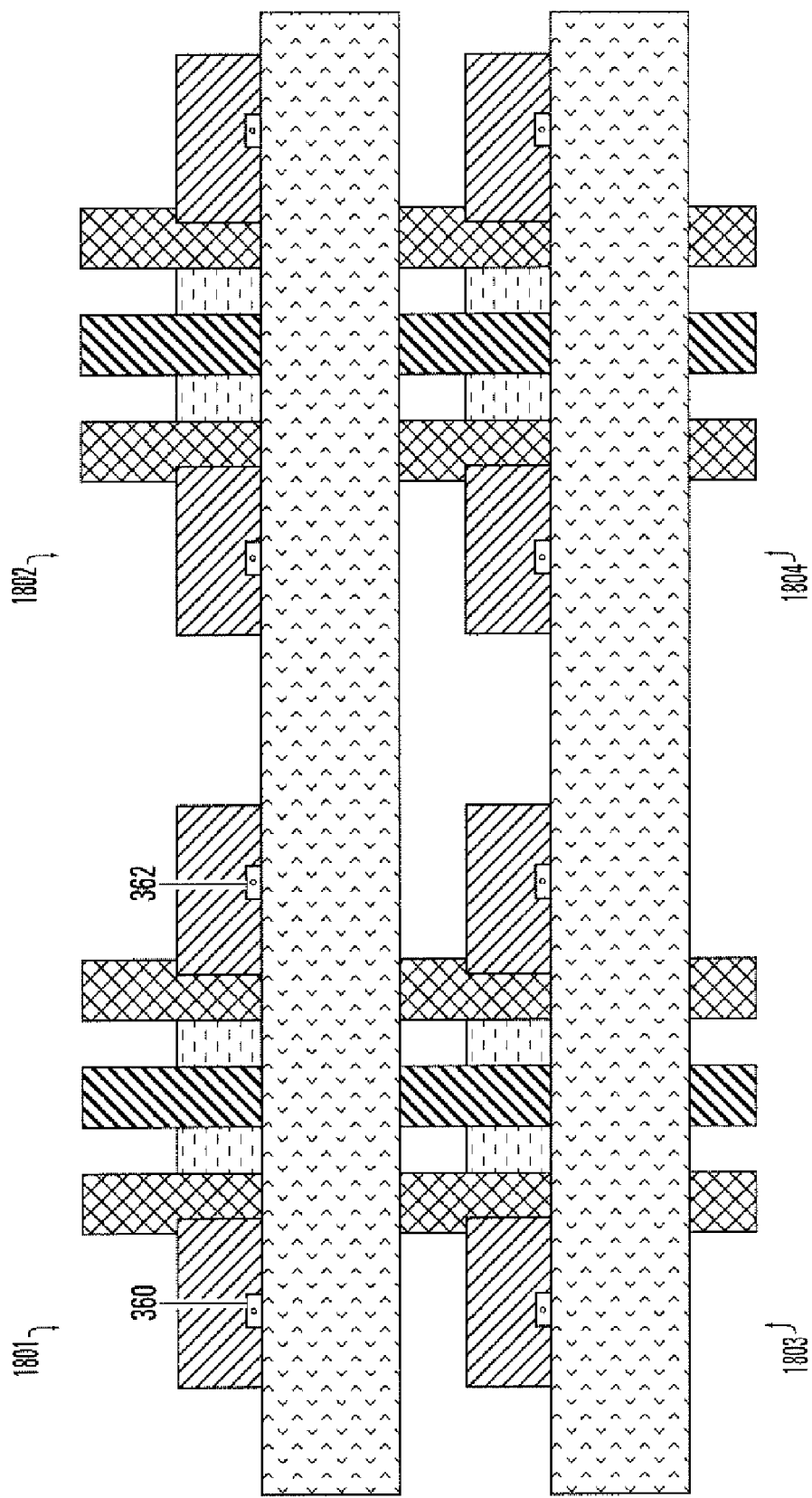
FIG. 21 is a layout diagram of a structure after a phase change material etching in accordance with the present invention.

FIG. 19 illustrates a layout diagram 1900 with a bit line in conductive layer 350 that extends across the bottom electrode 330a, the polysilicon line 320, the common source line 324, the polysilicon line 320 and a bottom electrode 330b in pair 1801 and across corresponding structures in pair 1802. Another bit line in conductive layer 350 extends across corresponding structures in pairs 1803 and 1804. FIG. 20 illustrates in layout view, the layer of programmable resistive material on the sidewalls of the bit line and underlying insulating layer, and contacting the bottom electrodes 330a, 330b. Also, trimmed photoresist masks 2010, 2020 are illustrated, overlying the side walls of the bit lines for each of the cell pairs. The side wall pins 360, 362, defined using the trimmed masks 2010, 2020, are shown in a layout diagram 2100 in FIG. 21.

The invention has been described with reference to specific exemplary embodiments. Various modifications, adaptations, and changes may be made without departing from the spirit and scope of the invention. Accordingly, the specification and drawings are to be regarded as illustrative of the principles of this invention rather than restrictive, the invention is defined by the following appended claims.

I claim:

1. A memory device, comprising:
    a first electrode having a principal surface, the principle surface having a perimeter;
    a second electrode vertically separated from the first electrode and having a sidewall, at least a portion of the sidewall of the second electrode positioned over the principle surface with a lateral offset from the perimeter of the first electrode;
    an insulating member disposed between the first and second electrodes, the insulating member overlying at least a portion of the principal surface of the first electrode, the insulating member having a side wall, the sidewall of the insulating member positioned over the principle surface with a lateral offset from the perimeter of the first electrode; and a memory element comprising a programmable resistive material, the memory element having a side wall portion extending along the side wall of the insulating member and contacting the sidewall of the second electrode, the side wall portion of the memory element having a bottom surface in contact with the principal surface of the first electrode.

2. The device of claim 1, wherein the side wall portion of the memory element extends substantially in a vertical direction on the sidewall of the insulating member and includes a foot portion extending substantially in a horizontal direction along the principle surface of the first electrode, the side wall portion having a sidewall in contact with and extending along the side wall of the insulating member, and the foot portion having a bottom surface in contact with the principal surface of the first electrode.

3. The device of claim 2, wherein the bottom surface of the foot portion is in contact with and positioned inside the perimeter on the principal surface of the first electrode.

4. The memory device of claim 2, further comprising a dielectric layer overlying and protecting the vertical portion and the foot portion of the memory element.

5. The device of claim 1, wherein the principal surface of the first electrode has one of a generally circular perimeter and a generally rectangular perimeter.

6. The device of claim 1, wherein the second electrode comprises a bit line.

7. The memory device of claim 4 wherein the dielectric layer comprises a low K material.

8. The device of claim 1, wherein the programmable resistive material has at least two solid phases which are reversibly inducible by a current.

9. The device of claim 8, wherein the at least two solid phases include a generally amorphous phase and a generally crystalline phase.

10. The device of claim 1, wherein the memory element comprises $Ge_2Sb_2Te_5$.

11. The device of claim 1, wherein the memory element comprises a combination of two or more materials from the group of Ge, Sb, Te, Se, In, Ti, Ga, Bi, Sn, Cu, Pd, Pb, Ag, S, or Au.

12. The device of claim 1, wherein the memory element has a thickness orthogonal to the sidewall of the insulating member less than 20 nm.

13. The device of claim 1, wherein the first electrode comprises Ti and N.

14. The device of claim 1, wherein the first electrode comprises Ta and N.

15. A memory device, comprising:
a conductive structure having a principal surface with a plurality of sides;
an insulating member over at least a portion of the principal surface of the conductive structure, the insulating member having a side wall;
an electrode over the insulating member; and
a programmable resistive material spacer along the side wall of the insulating member and in electrical communication with the conductive structure and the electrode, the spacer having a bottom side in contact with the principle surface and within the plurality of sides of the conductive structure, the spacer having a length extending from the conductive structure to the electrode along the side wall on the insulating layer, a width generally orthogonal to the length, and a thickness, and wherein the width and the thickness are less than 40 nm.

16. The device of claim 15, wherein the conductive structure comprises W.

17. The device of claim 15, wherein the electrode comprises a bit line.

* * * * *